US010475809B2

(12) United States Patent
Ito et al.

(10) Patent No.: US 10,475,809 B2
(45) Date of Patent: Nov. 12, 2019

(54) SEMICONDUCTOR MEMORY DEVICE

(71) Applicant: Toshiba Memory Corporation, Tokyo (JP)

(72) Inventors: Takamasa Ito, Nagoya Aichi (JP); Toshiaki Fukuzumi, Yokkaichi Mie (JP)

(73) Assignee: TOSHIBA MEMORY CORPORATION, Tokyo (JP)

(*) Notice: Subject to any disclaimer, the term of this patent is extended or adjusted under 35 U.S.C. 154(b) by 8 days.

(21) Appl. No.: 15/693,433

(22) Filed: Aug. 31, 2017

(65) Prior Publication Data
US 2018/0130820 A1   May 10, 2018

(30) Foreign Application Priority Data

Nov. 8, 2016   (JP) ................................ 2016-217885

(51) Int. Cl.
| H01L 27/11582 | (2017.01) |
| H01L 23/522 | (2006.01) |
| H01L 23/528 | (2006.01) |
| H01L 27/1157 | (2017.01) |
| H01L 27/11565 | (2017.01) |

(52) U.S. Cl.
CPC .... *H01L 27/11582* (2013.01); *H01L 23/5226* (2013.01); *H01L 23/5283* (2013.01); *H01L 27/1157* (2013.01); *H01L 27/11565* (2013.01)

(58) Field of Classification Search
CPC .......... H01L 27/11582; H01L 23/5226; H01L 23/5283; H01L 27/1157; H01L 27/11565
See application file for complete search history.

(56) References Cited

U.S. PATENT DOCUMENTS

| 7,936,004 B2 | 5/2011 | Kito et al. |
| 10,074,665 B2 * | 9/2018 | Kawaguchi ....... H01L 27/11582 |

FOREIGN PATENT DOCUMENTS

JP         2007266143 A     10/2007

* cited by examiner

*Primary Examiner* — Sonya D. McCall-Shepard
(74) *Attorney, Agent, or Firm* — Kim & Stewart LLP

(57) ABSTRACT

A semiconductor memory device includes a first electrode layer extending in a first direction, a second electrode layer above the first electrode layer and extending in the first direction, a third electrode layer above the first electrode layer and extending in the first direction, an insulating member between the second and third electrode layers and extending in the first direction, first semiconductor members extending in the second direction through the first and second electrodes, second semiconductor members extending in the second direction through the first and third electrode layers, and third semiconductor members extending in the second direction, each having a first portion between the second and third electrode layers and in contact with the insulating member, and a second portion extending through the first electrode layer. In the first direction, an arrangement density of the third semiconductor members is lower than that of the first or second semiconductor member.

17 Claims, 19 Drawing Sheets

FIG. 5
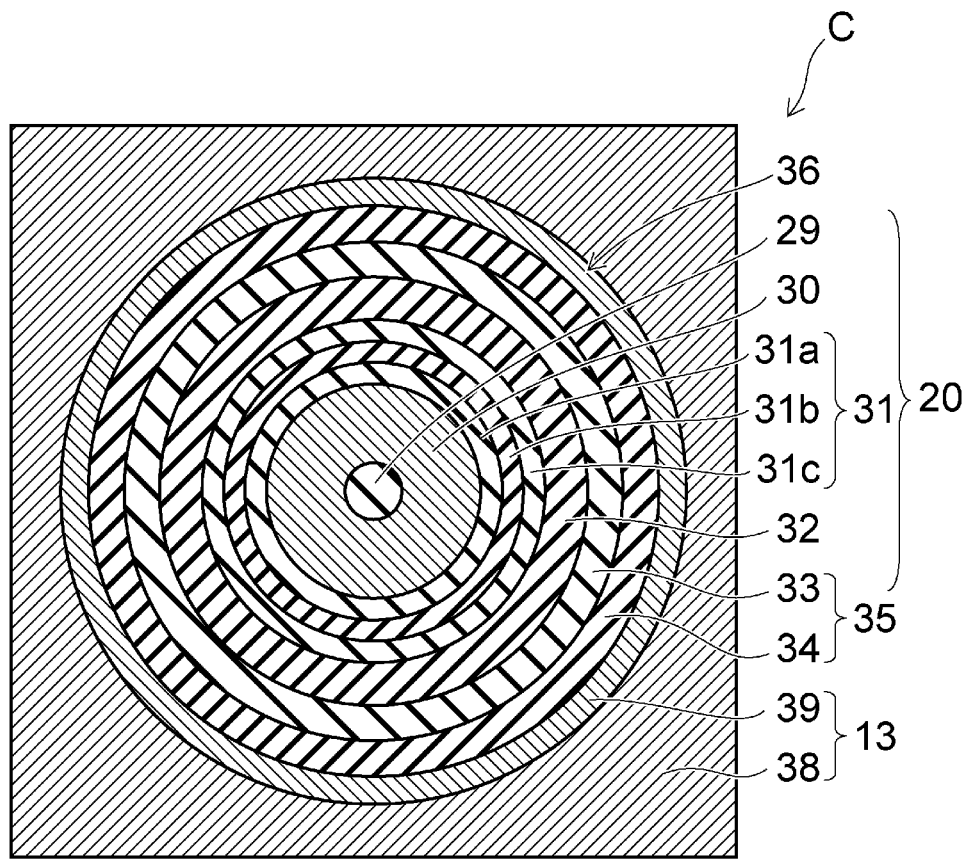
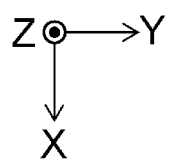

SEMICONDUCTOR MEMORY DEVICE

CROSS-REFERENCE TO RELATED APPLICATION

This application is based upon and claims the benefit of priority from Japanese Patent Application No. 2016-217885, filed Nov. 8, 2016, the entire contents of which are incorporated herein by reference.

FIELD

Embodiments described herein relate generally to a semiconductor memory device.

BACKGROUND

In recent years, a stacked type semiconductor memory device in which memory cells are three-dimensionally integrated has been developed. In such a stacked type semiconductor memory device, a stacked body in which electrode films and insulating films are alternately stacked on a semiconductor substrate is provided, and a semiconductor pillar penetrating the stacked body is provided. A memory cell transistor is formed at each intersection point of each electrode film and each semiconductor pillar. In such a stacked type semiconductor memory device, there is a problem that the resistance of the electrode film increases in accordance with high integration.

DESCRIPTION OF THE DRAWINGS

FIG. 5 is an enlarged plan view showing a region C of FIG. 2;

DETAILED DESCRIPTION

Embodiments provide a semiconductor memory device having an electrode film with low resistance.

In general, according to one embodiment, a semiconductor memory device includes a first electrode layer extending in a first direction, a second electrode layer provided in a second direction with respect to the first electrode layer, the second direction intersecting the first direction, the second electrode layer extending in the first direction, a third electrode layer provided in the second direction with respect to the first electrode layer, and extending in the first direction, an insulating member provided the second electrode layer and the third electrode layer, and extending in the first direction, first semiconductor members extending in the second direction through the first electrode layer and the second electrode layer, second semiconductor members extending in the second direction through the first electrode layer and the third electrode layer, and third semiconductor members extending in the second direction, each having a first portion that is between the second electrode layer and the third electrode layer and in contact with the insulating member, and a second portion that extends through the first electrode layer. In the first direction, an arrangement density of the third semiconductor members is lower than those of the first semiconductor members and the second semiconductor members.

(First Embodiment)

Figure 1:
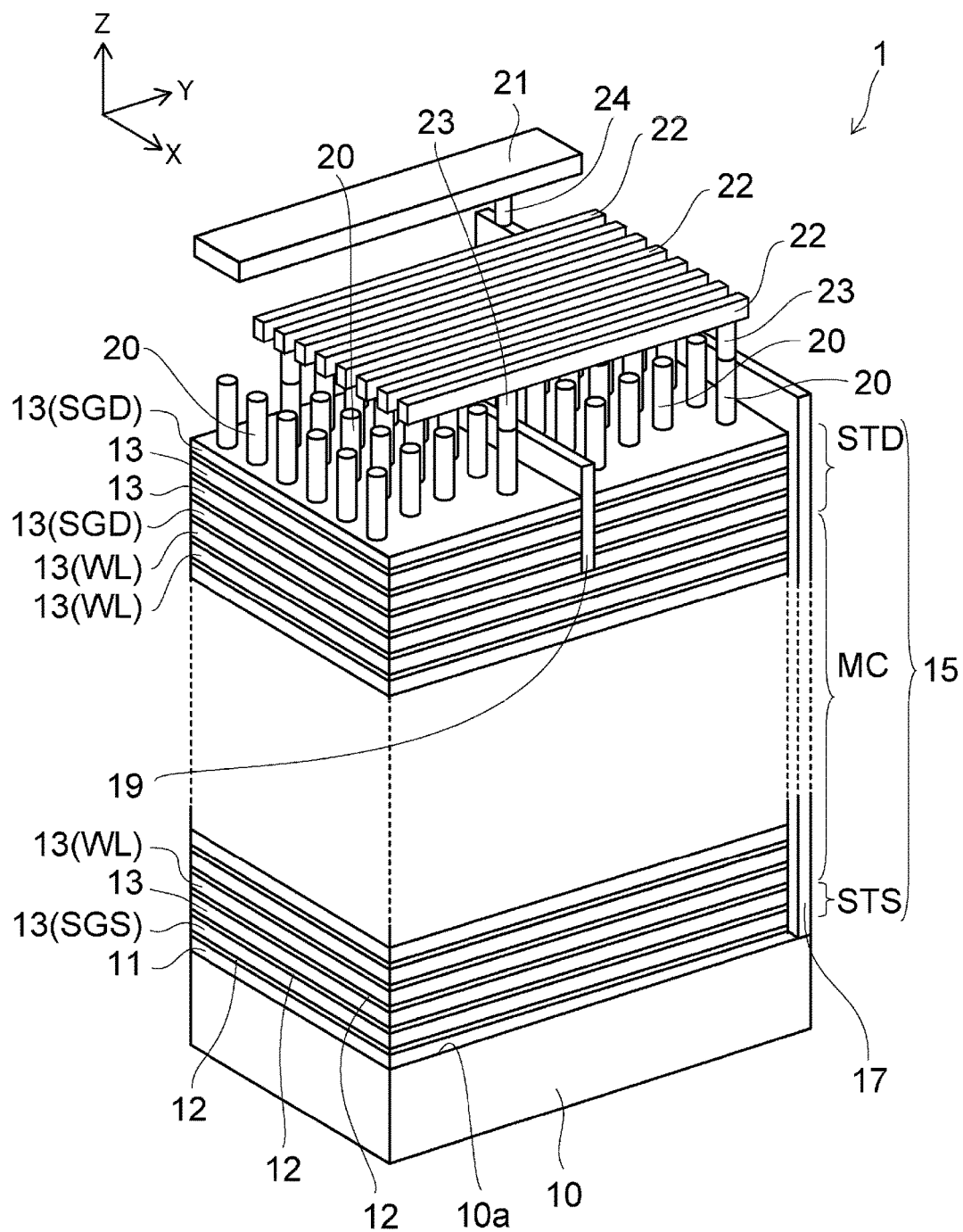
FIG. 1 is a perspective view showing a semiconductor memory device according to a first embodiment.
Figure 2:
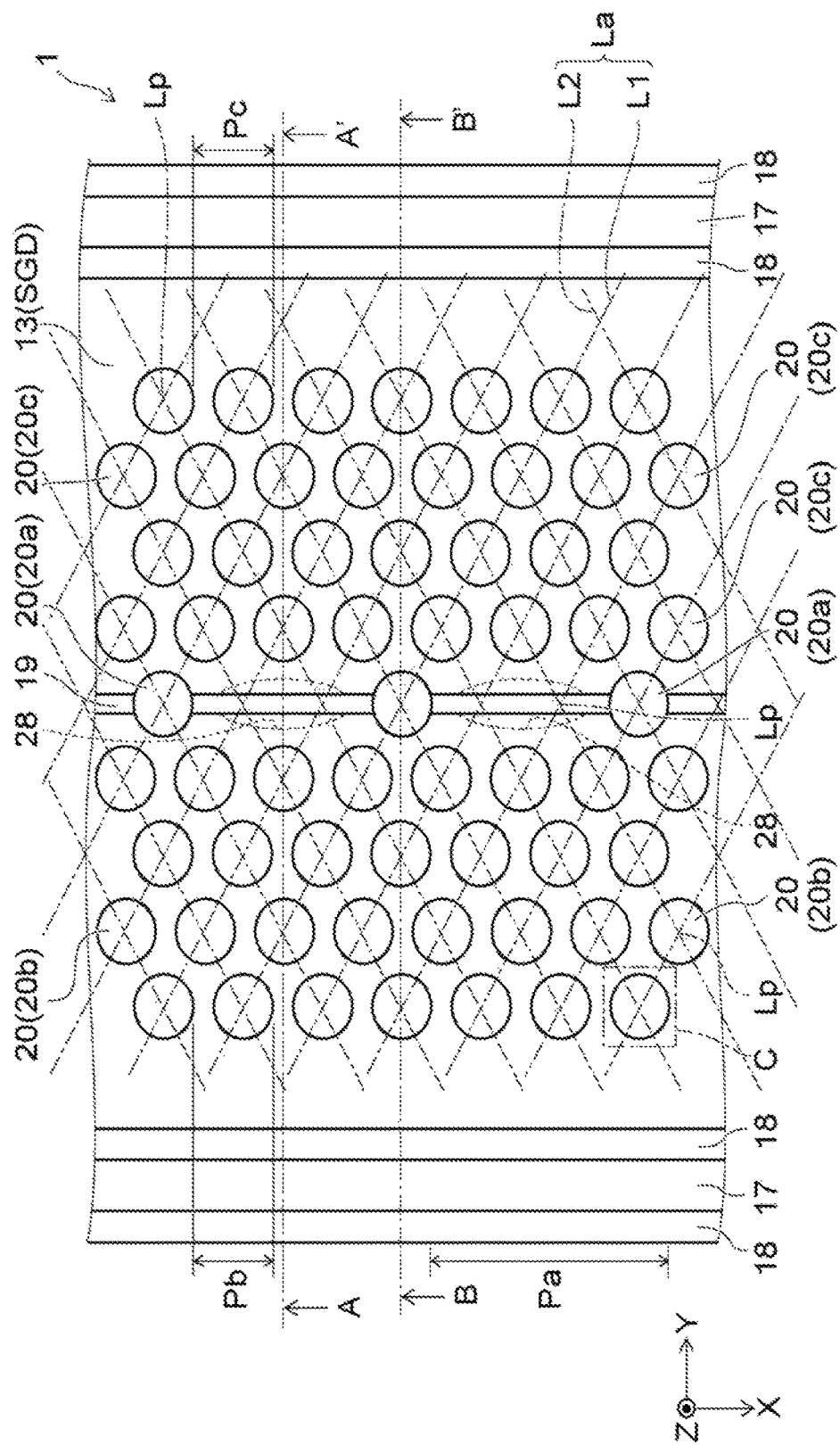
FIG. 2 is a plan view showing the semiconductor memory device according to the first embodiment.
Figure 3:
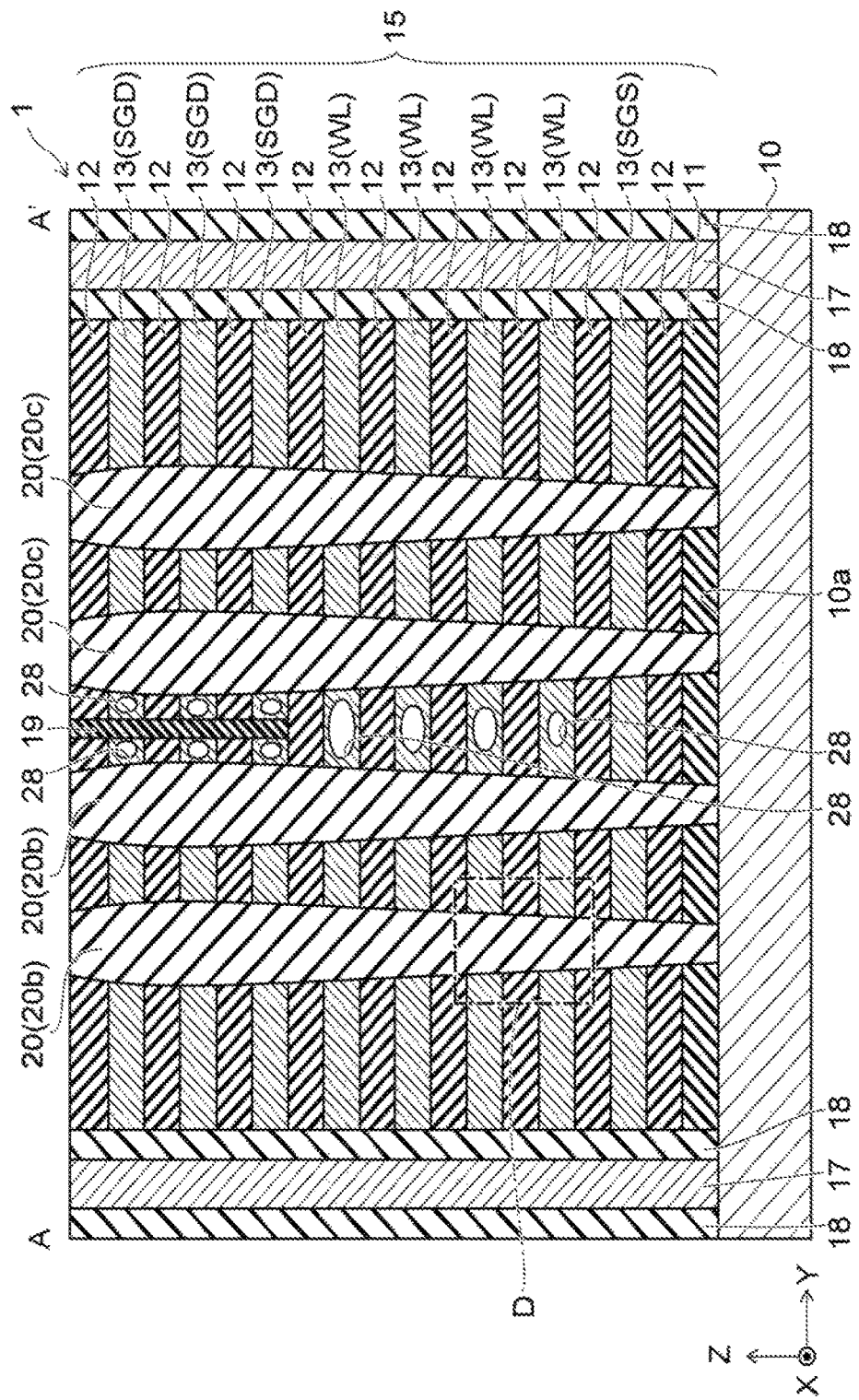
FIG. 3 is a sectional view taken along the line A-A' shown in FIG. 2.
Figure 4:
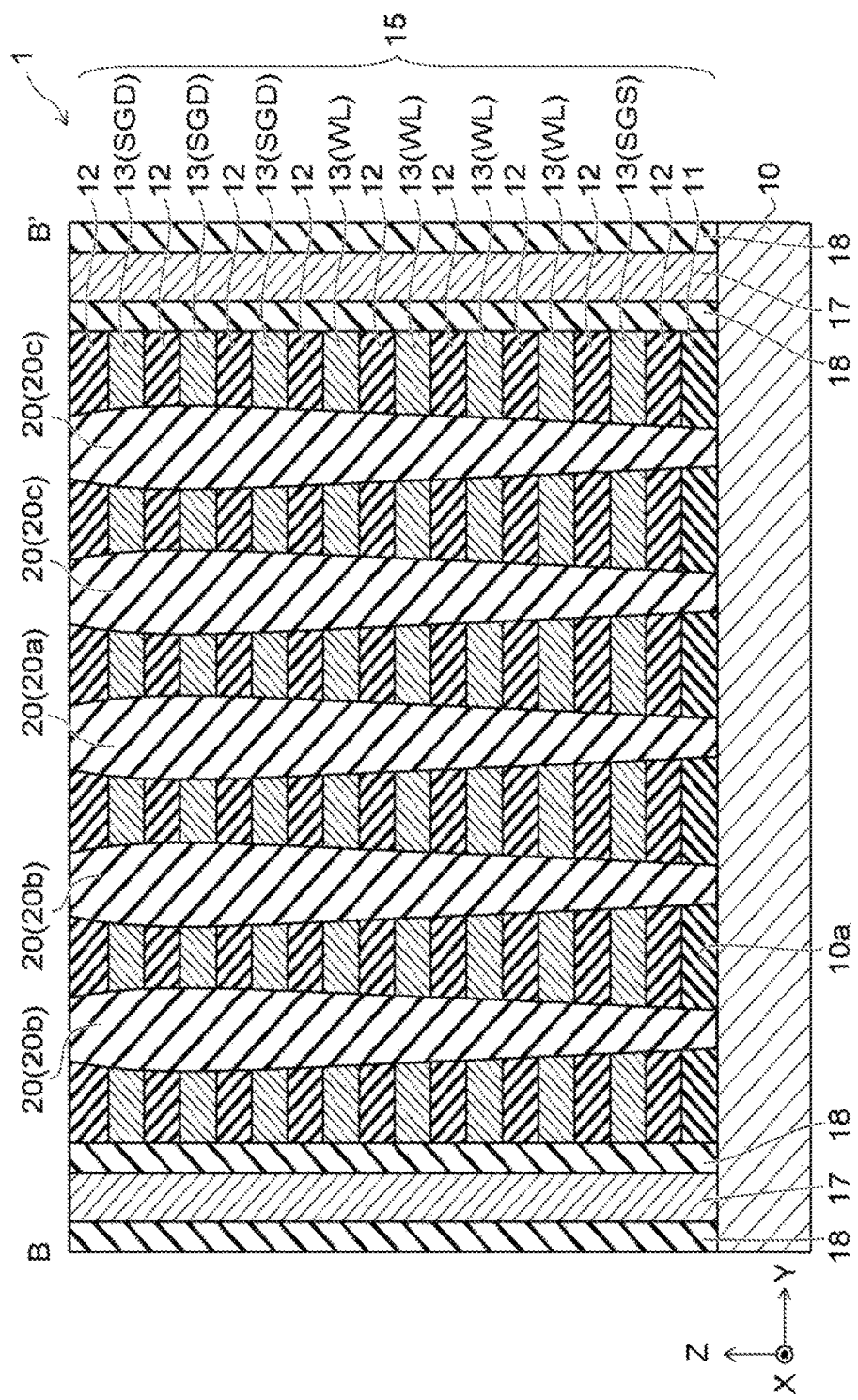
FIG. 4 is a sectional view taken along the line B-B' shown in FIG. 2.
Figure 6:
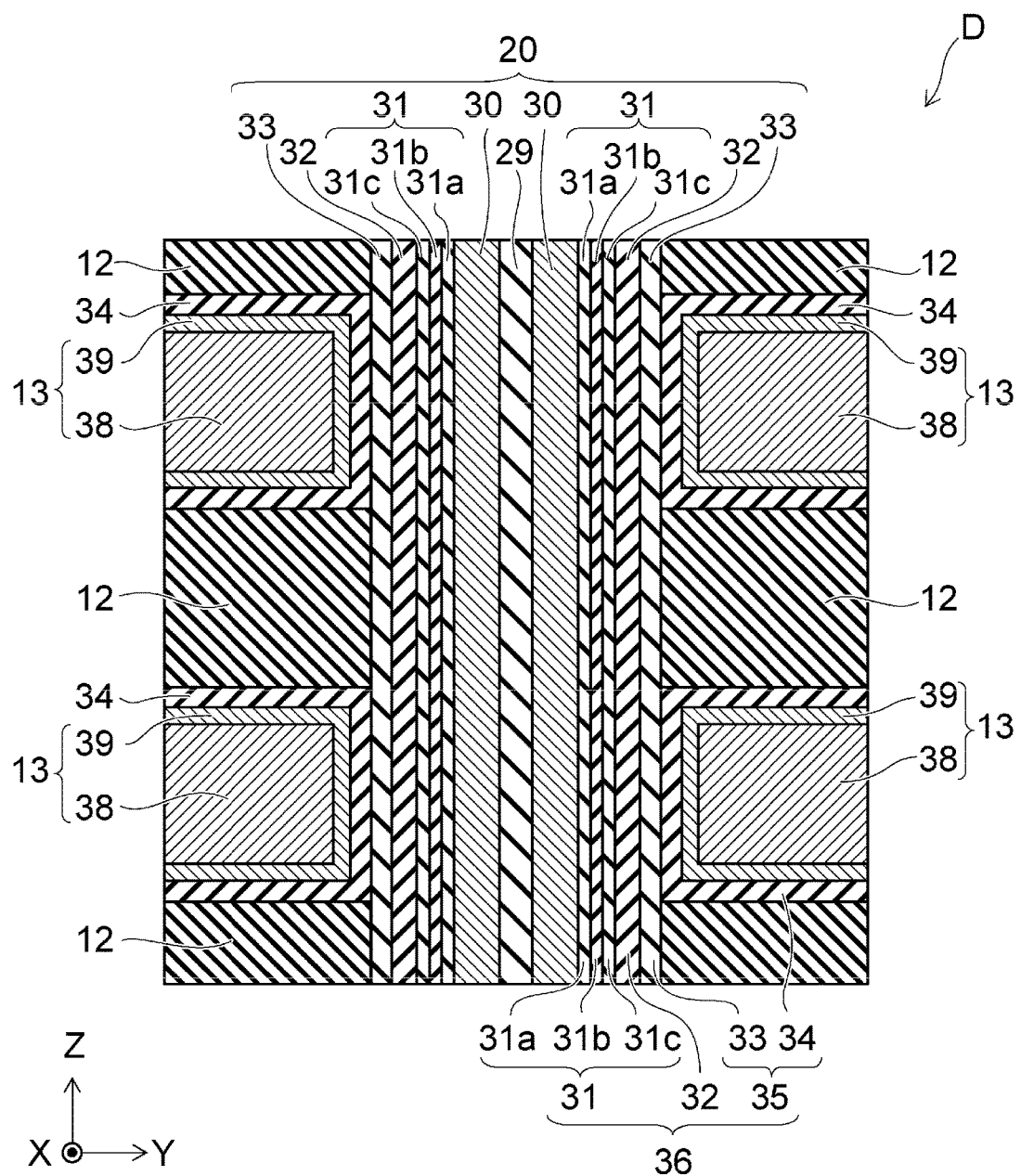
FIG. 6 is an enlarged sectional view showing a region D of FIG. 3.

First, a first embodiment will be described. FIG. 1 is a perspective view showing a semiconductor memory device according to the present embodiment. FIG. 2 is a plane view showing the semiconductor memory device according to the embodiment. FIG. 3 is a sectional view taken along the line A-A' shown in FIG. 2. FIG. 4 is a sectional view taken along the line B-B' shown in FIG. 2. FIG. 5 is an enlarged plan view showing a region C of FIG. 2. FIG. 6 is an enlarged sectional view showing a region D of FIG. 3.

It is noted that the respective drawings are schematic in which some parts are exaggerated or omitted as appropriate. For example, the actual number of components is greater than as drawn and each component is drawn larger than its actual size. In addition, the number of components, the dimensional ratio and the like are not always coincident between the drawings. The semiconductor memory device according to the embodiment is a stacked type NAND flash memory.

As shown in FIG. 1, a silicon substrate 10 is provided in a semiconductor memory device 1 (hereinafter also simply referred to as "device 1") according to the embodiment. The silicon substrate 10 is formed of, for example, a single crystal of silicon. A silicon oxide film 11 is provided on the silicon substrate 10.

Hereinafter, for convenience of explanation, an XYZ orthogonal coordinate system is used in the specification. Two directions parallel to the upper surface 10a of the silicon substrate 10 and perpendicular to each other are referred to as the "X direction" and "Y direction", and a direction perpendicular to the upper surface 10a of the silicon substrate 10 is referred to as the "Z direction". In addition, in the Z direction, the direction from the silicon substrate 10 toward the silicon oxide film 11 is referred to as "upper", and the reverse direction is referred to as "lower" in some cases, but this expression is used for convenience, irrelevant to the direction of gravity.

Further, in the specification, the "silicon oxide film" refers to a film containing silicon oxide ($SiO_2$) as a principal ingredient, and includes silicon (Si) and oxygen (O). The same applies to other components; that is, when the name of a component includes the name of a material, the material is the principal ingredient of the component. Further, since silicon oxide is generally an insulating material, the silicon oxide film is an insulating film unless otherwise specified. The same also applies to other members; that is, in principle, the characteristics of a member reflect the characteristics of the principal ingredient thereof.

Silicon oxide films 12 and electrode films 13 are alternately stacked on the silicon oxide film 11 along the Z direction. A stacked body 15 is formed by the silicon oxide film 11, and a plurality of silicon oxide films 12 and a plurality of electrode films 13 which are alternately stacked. The longitudinal direction of the stacked body 15 is defined as the X direction. As shown in FIG. 2, Source electrode plates 17 are provided at positions sandwiching the stacked body 15 in the Y direction. The lower end of the source electrode plates 17 are connected to the silicon substrate 10 (see FIG. 1). Each electrode film 13 has a band-like shape extending in the X direction, the longest longitudinal direction thereof corresponding to the X direction, the next longest width direction corresponding to the Y direction, the shortest thickness direction corresponding to the Z direction.

In the device 1, a plurality of stacked bodies 15 and a plurality of source electrode plates 17 are provided, which are alternately arranged along the Y direction. An insulating plate 18 (see FIG. 2) made of, for example, silicon oxide is provided between each of the stacked bodies 15 and each of the source electrode plates 17.

Columnar members 20 extending in the Z direction and penetrating the stacked body 15 are provided in the stacked body 15. The lower end of each of the columnar members 20 is in contact with the silicon substrate 10, and the upper end thereof is exposed at the upper surface of the stacked body 15. As will be described later, one silicon pillar 30 extending in the Z direction (see FIGS. 5 and 6) is provided in each columnar member 20.

A source line 21 and a plurality of bit lines 22 extending in the Y direction are provided above the stacked body 15. The source line 21 is provided above the bit lines 22. The source line 21 is connected to the upper end of the source electrode plate 17 through a plug 24. Further, each of the bit lines 22 is connected to the upper end of each silicon pillar 30 through each plug 23. Thus, a current path of [bit line 22-plug 23-silicon pillar 30-silicon substrate 10-source electrode plate 17-plug 24-source line 21] is formed, and each silicon pillar 30 is connected between each bit line 22 and the source line 21.

In the stacked body 15, one or more electrode films 13 from the top function as upper selection gate lines SGD, and an upper selection gate transistor STD is formed at the intersection of each upper selection gate line SGD and each columnar member 20. In addition, one or more electrode films 13 from the bottom function as lower selection gate lines SGS, and a lower selection gate transistor STS is formed at the intersection of each lower selection gate line SGS and each columnar member 20. The electrode films 13 other than the lower selection gate lines SGS and the upper selection gate lines SGD function as word lines WL, and a memory cell transistor MC is formed at the intersection of each word line WL and each columnar member 20. As a result, a plurality of memory cell transistors MC are connected in series along the silicon pillars 30, respectively, and the lower selection gate transistors STS and the upper selection gate transistors STD are connected to both ends of the memory cell transistors MC in the Z direction, respectively, to form a NAND string.

An insulating member 19 extending in the X direction is provided in the center portion in the Y direction of the upper portion of the stacked body 15, and the electrode films 13 serving as the upper selection gate lines SGD are divided into two parts in the Y direction. The insulating member 19 is made of, for example, silicon oxide. The insulating member 19 has a band-like shape. The insulating member 19 does not reach the electrode films 13 serving as the word lines WL, therefore, the electrode films 13 serving as the word lines WL are not divided. For this reason, two upper selection gate lines SGD arranged at the same height in the Z direction are disposed above one word line WL. In other words, the insulating member 19 is disposed between the two upper selection gate lines SGD arranged at the same height in the Z direction.

As shown in FIG. 2, the columnar members 20 are arranged substantially periodically along the XY plane. However, number of the columnar members 20 is reduced at the center portion in the Y direction of the stacked body 15, and the periodicity is disordered.

More specifically, each columnar member 20 is disposed at a position including a lattice point Lp of a virtual lattice La set in the XY plane. A lattice La is constituted by each of a plurality of mutually parallel virtual straight lines L1 and each of a plurality of mutually parallel virtual straight lines L2. The straight line L1 extends in a direction parallel to the XY plane and intersecting both the X direction and the Y direction. The straight line L2 also extends in a direction parallel to the XY plane and intersecting both the X direction and the Y direction. The straight line L2 also intersects the straight line L1.

Hereinafter, for the sake of convenience of explanation, among the columnar members 20, columnar members 20 disposed at the center portion of the stacked body 15 in the Y direction, that is, at a position interposed in the insulating member 19 are sometimes referred to as "columnar members 20a". The columnar members 20a are arranged in a line along the X direction, and divide the insulating member 19 in the X direction. Further, in one stacked body 15, with respect to the column formed by the columnar members 20a, columnar members 20 disposed on one side in the Y direction are sometimes referred to as "columnar members 20b", and columnar members 20 disposed on the other side in the Y direction are sometimes referred to as "columnar members 20c". The "columnar member(s) 20" is the generic term for columnar members 20a, 20b and 20c. In the example shown in FIG. 2, the four columnar members 20b are arranged along the straight line L1, and the four columnar members 20c are also arranged along the straight line L1. That is, in one stacked body 15, the four columnar members 20b and 20c are arranged on both sides of the insulating member 19 in the Y direction.

Next, the positional relationship between each columnar member 20 and each electrode film 13 will be described. An upper portion of each columnar member 20a is disposed between two upper selection gate lines SGD adjacent to each other in the Y direction. The middle portion of the columnar member 20a penetrates the word lines WL. The lower portion of the columnar member 20*a* penetrates the lower selection gate line SGS. On the other hand, the upper portion of each columnar member 20*b* penetrates the upper selection gate lines SGD, the middle portion penetrates the word lines WL, and the lower portion penetrates the lower selection gate line SGS. The positional relationship between each columnar member 20*c* and each electrode film 13 is the same as the positional relationship between each columnar member 20*b* and each electrode film 13.

The columnar members 20*b* and 20*c* are arranged at lattice points Lp aligned along the X direction. On the other hand, the columnar members 20*a* are arranged at intervals of several lattice points Lp aligned along the X direction. In the example shown in FIG. 2, the columnar members 20*a* are arranged at one out of three lattice points Lp, and the columnar members 20*a* are not arranged at the remaining two lattice points Lp. Therefore, the arrangement interval Pa of the columnar members 20*a* in the X direction is longer than the arrangement interval Pb of the columnar members 20*b* and the arrangement interval Pc of the columnar members 20*c* in the X direction. Further, the arrangement interval Pb is equal to the arrangement interval Pc. That is, Pa>Pb=Pc. The arrangement interval Pa is an integral multiple, three times in the example shown in FIG. 2, of the arrangement interval Pb and the arrangement interval Pc. Accordingly, the arrangement density of the columnar members 20*a* in the X direction is lower than the arrangement density of the columnar members 20*b* and the arrangement density of the columnar members 20*c* in the X direction.

As shown in FIGS. 2 to 4, each columnar member 20 has roughly a columnar shape, but, in detail, has a borehole shape. That is, the diameter of the columnar member 20 takes a maximum value at a position slightly lower than the upper end, continuously decreases upward and downward from this position, and takes a minimum value at the lower end.

A void 28 is formed in a portion between the columnar members 20*a* in the electrode film 13. The void 28 is separated from the silicon oxide film 12, the columnar member 20 and the insulating member 19. For example, a gas containing fluorine (F) is encapsulated in the void 28. The void 28 is relatively large at the upper and middle portions of the stacked body 15 and relatively small at the lower portion. The formation of the void 28 depends on the manufacturing conditions of the device 1, thus, the void 28 may not be formed in some cases, depending on manufacturing conditions.

Further, the plug 24 is provided on the silicon pillar 30 provided in the columnar member 20*b* and on the silicon pillar 30 provided in the columnar member 20*c*, and is connected to these silicon pillars 30, but no plug 24 is provided on the silicon pillar 30 provided in the columnar member 20*a*. Accordingly, the silicon pillar 30 provided in the columnar member 20*a* is insulated from the bit line 22, thus, no NAND string is formed along the columnar member 20*a*.

As shown in FIGS. 5 and 6, in the columnar member 20, a core member 29, the silicon pillar 30, a tunnel insulating film 31, a charge storage film 32, and a silicon oxide layer 33 are provided from the center axis toward the peripheral surface. The core member 29 is made of silicon oxide, and has a substantially columnar shape with the Z direction as the axial direction. The core member 29 is disposed at a position including the center axis of the columnar member 20. The silicon pillar 30 is made of polysilicon, and has a cylindrical shape which extends in the Z direction and whose lower end is closed. The tunnel insulating film 31 is provided around the silicon pillar 30, the charge storage film 32 is provided around the tunnel insulating film 31, and the silicon oxide layer 33 is provided around the charge storage film 32. The tunnel insulating film 31, the charge storage film 32 and the silicon oxide layer 33 have each a cylindrical shape with the Z direction as the axial direction.

The tunnel insulating film 31 normally has insulating property, but allows a tunnel current to flow when predetermined voltage is applied within the range of the driving voltage of the device 1; for example, the tunnel insulating film 31 is an ONO film including a silicon oxide layer 31*a*, a silicon nitride layer 31*b*, and a silicon oxide layer 31*c* stacked in this order. The charge storage film 32 is capable of accumulating charges, and is made of, for example, a material including a trap site of electrons, such as silicon nitride.

On the other hand, an aluminum oxide layer 34 is provided on the surface of the electrode film 13. A block insulating film 35 includes the silicon oxide layer 33 and the aluminum oxide layer 34. The block insulating film 35 does not substantially allow current to flow even if voltage is applied within the driving voltage range of the device 1. A memory film 36 is formed by the tunnel insulating film 31, the charge storage film 32 and the block insulating film 35. For example, the average nitrogen concentration of the charge storage film 32 is higher than the average nitrogen concentration of the tunnel insulating film 31 and the average nitrogen concentration of the block insulating film 35.

A main body portion 38 made of tungsten (W) is provided in the electrode film 13, and a barrier metal layer 39 in which a titanium (Ti) layer and a titanium nitride (TiN) layer are stacked is provided on the surface of the main body portion 38. The main body portion 38 is in contact with the source electrode plate 17. A region other than the region in contact with the source electrode plate 17 on the surface of the main body portion 38 is in contact with the barrier metal layer 39. The barrier metal layer 39 is in contact with the aluminum oxide layer 34.

Next, a method of manufacturing the semiconductor memory device according to the embodiment will be described. FIGS. 7-10 are sectional views showing a method of manufacturing the semiconductor memory device according to the embodiment. FIGS. 7-10 show cross sections corresponding to FIG. 3.

Figure 7:
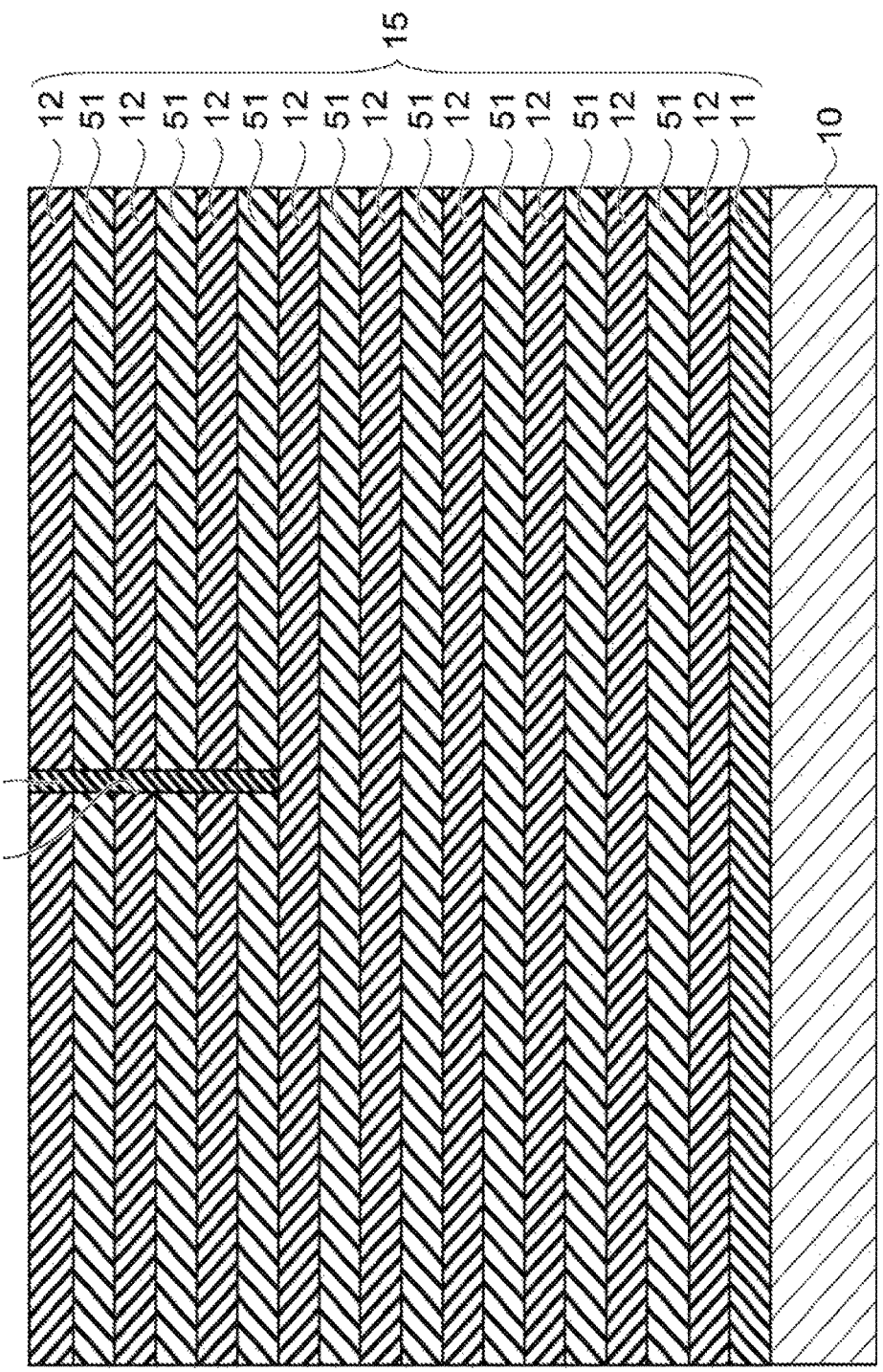
FIG. 7 is a sectional view showing a method of manufacturing the semiconductor memory device according to the first embodiment.

First, as shown in FIG. 7, the silicon substrate 10 is prepared. Next, the silicon oxide film 11 is formed on the entire surface of the silicon substrate 10. Next, the silicon oxide film 12 and the silicon nitride film 51 are alternately formed on the silicon oxide film 11 to form the stacked body 15.

Next, a groove 53 extending in the X direction is formed in the upper portion of the stacked body 15 by, for example, a lithography method. A plurality of grooves 53 arranged periodically in the Y direction are formed. Each groove 53 divides the silicon nitride films 51 that are to be replaced with the upper selection gate lines SGD (see FIG. 3) in a later step, and does not divide the silicon nitride films 51 that are to be replaced with the word lines WL (see FIG. 3) or the lower selection gate line SGS (see FIG. 3) in a later step. Next, silicon oxide is buried in the groove 53 to form the insulating member 19.

Figure 8:
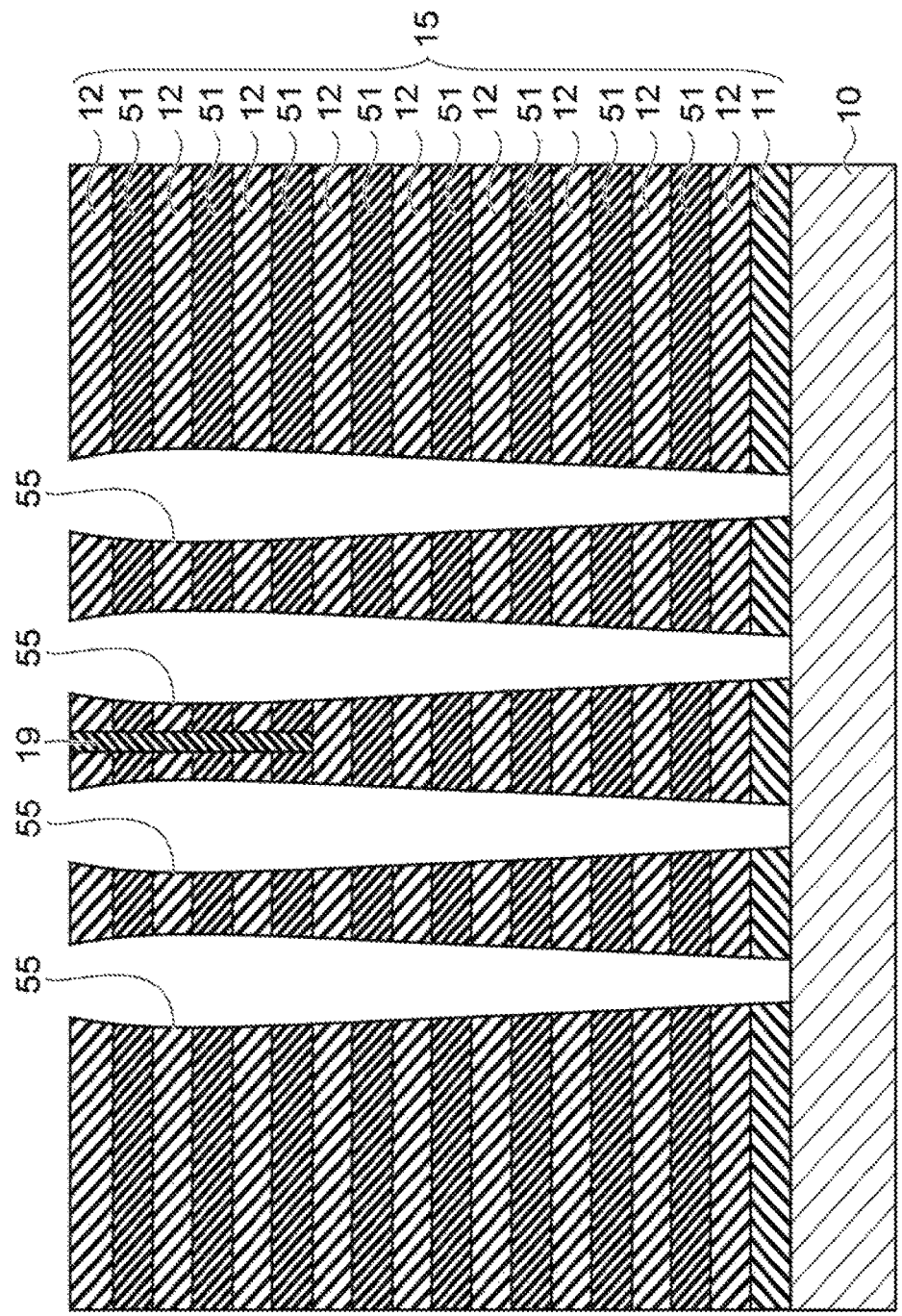
FIG. 8 is a sectional view showing a method of manufacturing the semiconductor memory device according to the first embodiment.

Next, a resist mask (not shown) is formed on the stacked body 15 by a lithography method, and anisotropic etching such as RIE (Reactive Ion Etching) is performed using the resist mask as a mask. Thus, memory holes 55 are formed in the stacked body 15, as shown in FIG. 8. Each memory hole 55 has a substantially columnar shape extending in the Z direction, and its diameter increases continuously downward from the upper surface of the stacked body 15, takes a maximum value at a position slightly lower than the upper surface, continuously decreases downward from this position, and takes a minimum value at the lower surface of the stacked body 15. The silicon substrate 10 is exposed at the bottom surface of the memory hole 55. The insulating member 19 is divided by a part of the memory hole 55.

Figure 9:
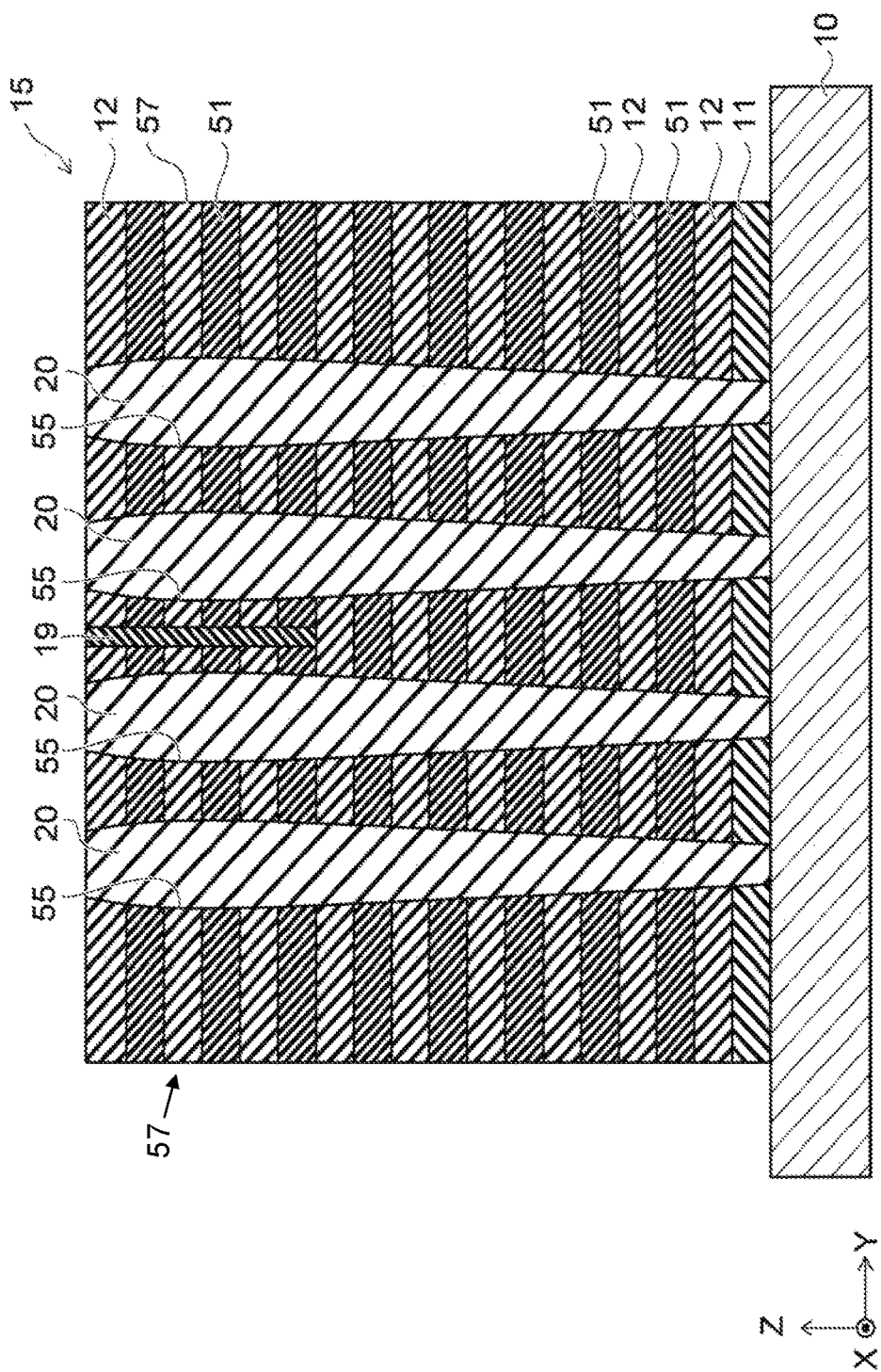
FIG. 9 is a sectional view showing a method of manufacturing the semiconductor memory device according to the first embodiment.

Next, as shown in FIG. 9, each columnar member 20 is formed in the memory hole 55. Specifically, silicon is epitaxially grown on the bottom surface of the memory hole 55 from the silicon substrate 10 as a starting point to form an epitaxial silicon member (not shown).

Next, referring to FIGS. 5 and 6, the silicon oxide layer 33 is formed on the inner surface of the memory hole 55. Next, silicon nitride is deposited to form the charge storage film 32. Next, silicon oxide, silicon nitride and silicon oxide are deposited in this order to form a silicon oxide layer 31c, a silicon nitride layer 31b and a silicon oxide layer 31a, thereby, the tunnel insulating film 31 is formed.

Next, a cover silicon layer (not shown) is formed by depositing silicon, RIE is performed, the cover silicon layer, the tunnel insulating film 31, the charge storage film 32 and the silicon oxide layer 33 are removed to expose the epitaxial silicon member. Next, silicon is deposited to form a body silicon layer. The body silicon layer is in contact with the epitaxial silicon member and the tunnel insulating film 31. The silicon pillar 30 is formed by the cover silicon layer and the body silicon layer. Next, the core member 29 is formed by depositing silicon oxide. The memory hole 55 is embedded by the core member 29. In this manner, the columnar member 20 is formed.

Next, as shown in FIG. 9, slits 57 are formed in the stacked body 15. The slits 57 penetrate the stacked body 15 in the X direction and the Z direction.

Figure 10:
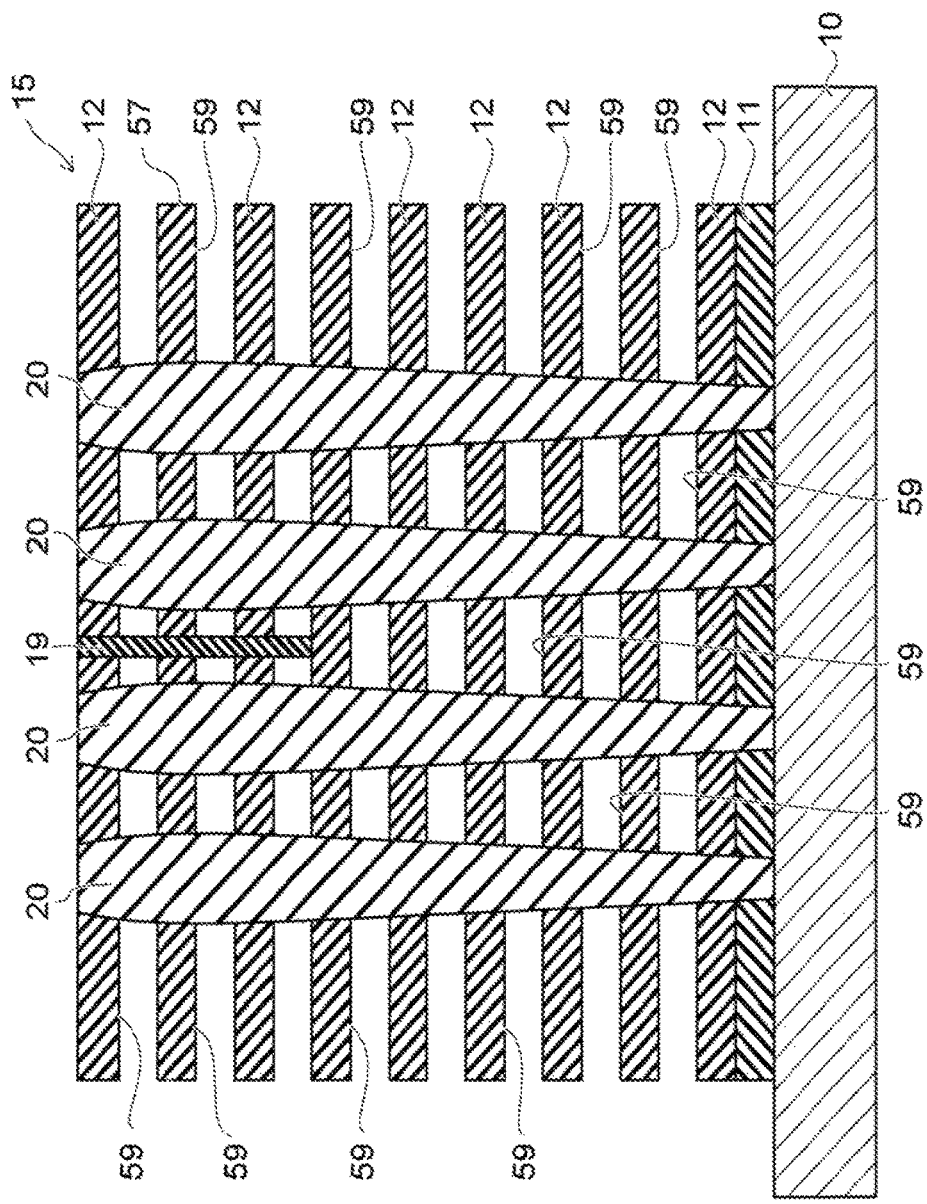
FIG. 10 is a sectional view showing a method of manufacturing the semiconductor memory device according to the first embodiment.

Next, as shown in FIG. 10, wet etching is performed, for example, by introducing hot phosphoric acid through the slits 57 to remove the silicon nitride film 51. At this time, the silicon oxide film 12, the insulating member 19 and the columnar member 20 are not substantially removed, and the columnar member 20 supports the silicon oxide film 12. Thus, a space 59 is formed between the silicon oxide films 12.

Next, aluminum oxide is deposited through the slits 57 to form the aluminum oxide layer 34 on the inner surface of the space 59 (see FIG. 6). The aluminum oxide layer 34 is in contact with the silicon oxide layer 33, the silicon oxide film 12 and the insulating member 19 (shown in FIGS. 2 and 3). The block insulating film 35 includes the silicon oxide layer 33 and the aluminum oxide layer 34. The memory film 36 is formed by the tunnel insulating film 31, the charge storage film 32 and the block insulating film 35.

Next, titanium nitride and titanium are deposited through the slits 57 to form the barrier metal layer 39 on the aluminum oxide layer 34. Next, tungsten is deposited in the space 59 through the slits 57 by CVD (Chemical Vapor Deposition) using tungsten hexafluoride gas ($WF_6$) as a raw material gas, for example, to form the main body portion 38. Next, etching is performed, and tungsten, titanium, titanium nitride and aluminum oxide are removed from the inside of the slits 57 so as to be left only in the space 59. Thus, the electrode film 13 is formed in the space 59. In this way, the silicon nitride film 51 is replaced with the electrode film 13.

However, in the step of depositing tungsten described above, since the portion of the space 59 located in the center portion in the Y direction of the stacked body 15 is far from the slits 57 on both sides in the Y direction, tungsten is difficult to deposit, thus, tungsten may not be completely embedded. In this case, the void 28 is formed in the electrode film 13. In the void 28, a gas containing fluorine (F) derived from CVD raw material gas ($WF_6$) is often encapsulated.

In the upper portion and the middle portion of the stacked body 15 where the diameter of each columnar member 20 is relatively large, the distance between the columnar members 20 is relatively short, and tungsten is difficult to deposit, thus, the void 28 is likely to be formed. On the other hand, in the lower portion of the stacked body 15 where the diameter of the columnar member 20 is relatively small, the distance between the columnar members 20 is relatively long and tungsten is easily deposited, thus, the void 28 is difficult to be formed. As a result, the void 28 formed in the lower portion of the stacked body 15 is often smaller than the void 28 formed in the middle portion and the upper portion of the stacked body 15, and even if the void 28 is formed in the middle portion and the upper portion of the stacked body 15, the void 28 may not be formed in the lower portion of the stacked body 15.

Next, silicon oxide is deposited, and the insulating plate 18 is formed on the side surface of the slit 57. Next, a conductive material such as tungsten is deposited, and the source electrode plate 17 is formed in the slits 57.

Next, referring to FIG. 1, the plug 23 is formed on the silicon pillar 30 and the plug 24 is formed on the source electrode plate 17. Next, the bit line 22 extending in the Y direction is formed and connected to the plug 23. Next, the source line 21 extending in the Y direction is formed and connected to the plug 24. In this way, the semiconductor memory device 1 according to the embodiment is manufactured.

Next, the effects of the embodiment will be described. In the embodiment, since the columnar member 20a is provided in the center portion in the Y direction of the stacked body 15, the average size of the voids 28 is reduced. Therefore, the electric resistance of the electrode film 13 in the X direction is reduced. As a result, the operation speed of the semiconductor memory device 1 can be improved.

In addition, since the arrangement density of the columnar members 20a in the X direction is lower than the arrangement density of the columnar members 20b and 20c in the X direction, a current path with less interposition of the columnar member 20 is realized in the center portion in the Y direction of the electrode film 13. Thus, it is possible to prevent an increase in the electric resistance of the electrode film 13 due to the interposition of the columnar member 20, and reduce the electric resistance of the electrode film 13. This also improves the operation speed of the semiconductor memory device 1.

Furthermore, the formation of voids 28 is reduced, thus, the possibility that the stacked body 15 collapses is reduced. In addition, the columnar member 20a supports the stacked body 15 together with the columnar members 20b and 20c, thus, the possibility that the stacked body 15 collapses is also reduced.

FIRST COMPARATIVE EXAMPLE

Figure 11:
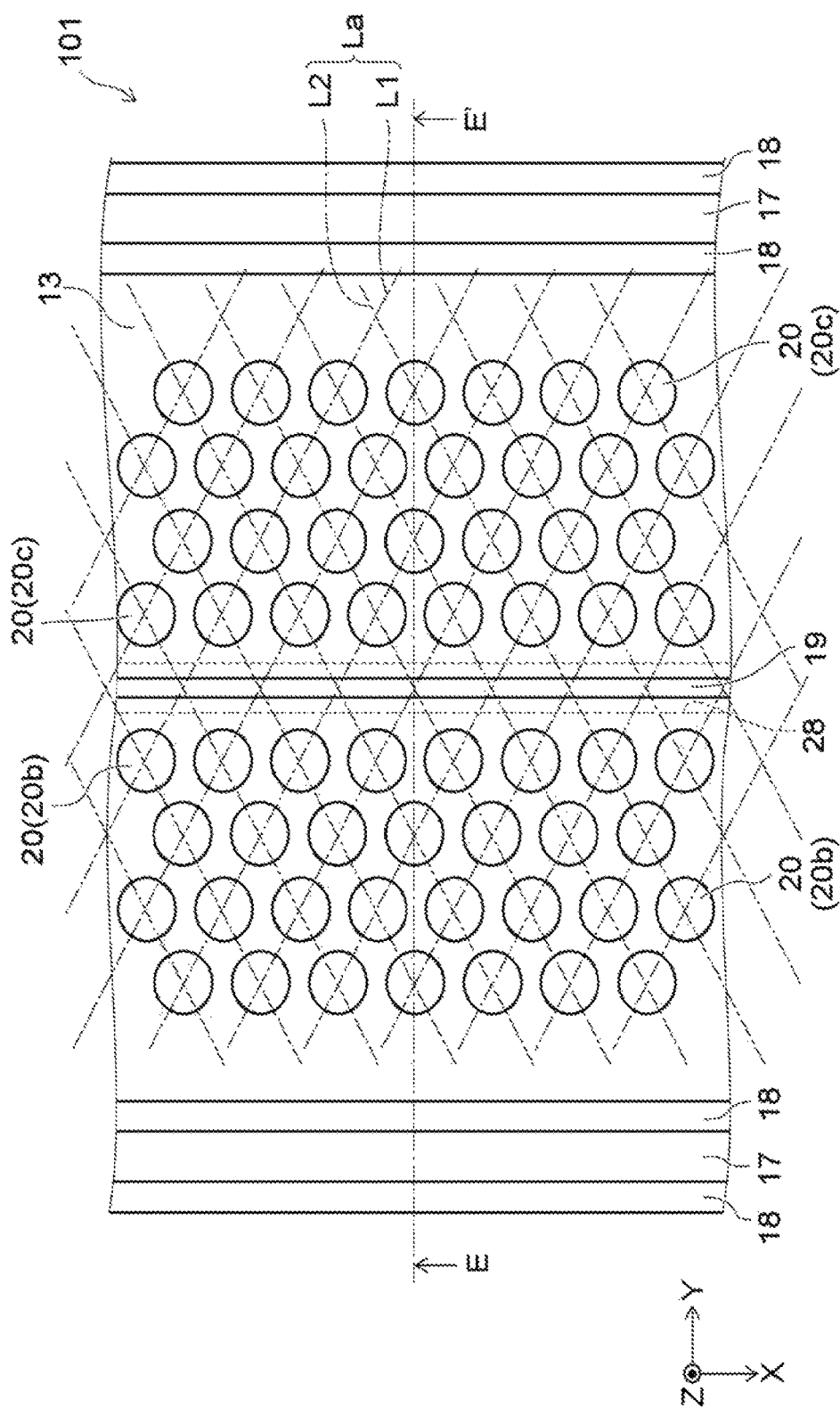
FIG. 11 is a plan view showing a semiconductor memory device according to a first comparative example.
Figure 12:
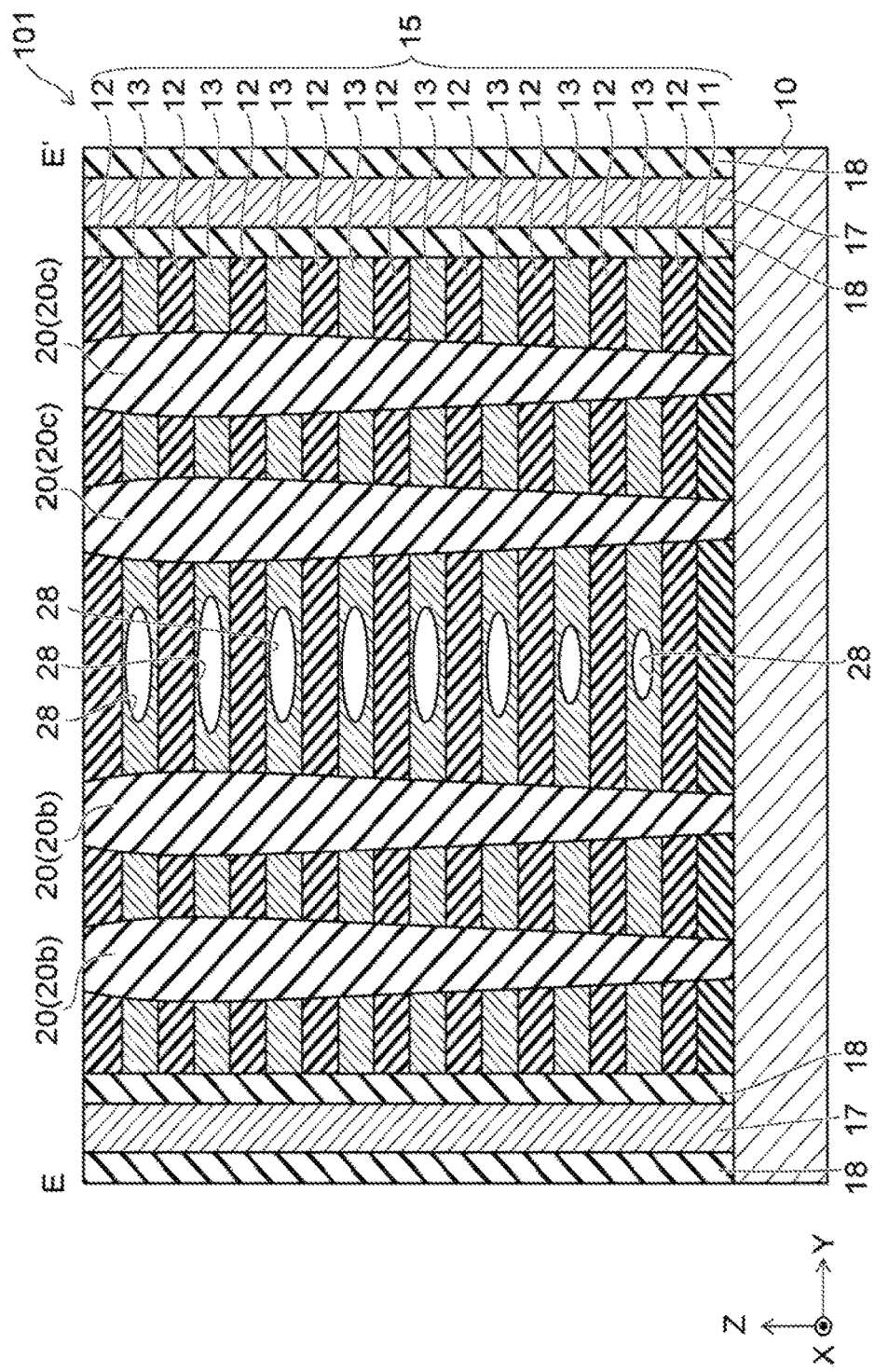
FIG. 12 is a sectional view taken along the line E-E' shown in FIG. 11.

Next, a first comparative example will be described. FIG. 11 is a plane view showing a semiconductor memory device according to the comparative example. FIG. 12 is a sectional view taken along the line E-E' shown in FIG. 11.

As shown in FIG. 11 and FIG. 12, in a semiconductor memory device 101 according to the comparative example, no columnar member 20a (see FIG. 2) is provided in the center portion in the Y direction of the stacked body 15. Therefore, a large void 28 is formed in the center portion in the Y direction of the electrode film 13. As a result, the semiconductor memory device 101 has a higher electric resistance of the electrode film 13 and a lower operation speed compared with the semiconductor memory device 1 (see FIG. 2). Further, in some cases, the stacked body 15 may collapse.

SECOND COMPARATIVE EXAMPLE

Figure 13:
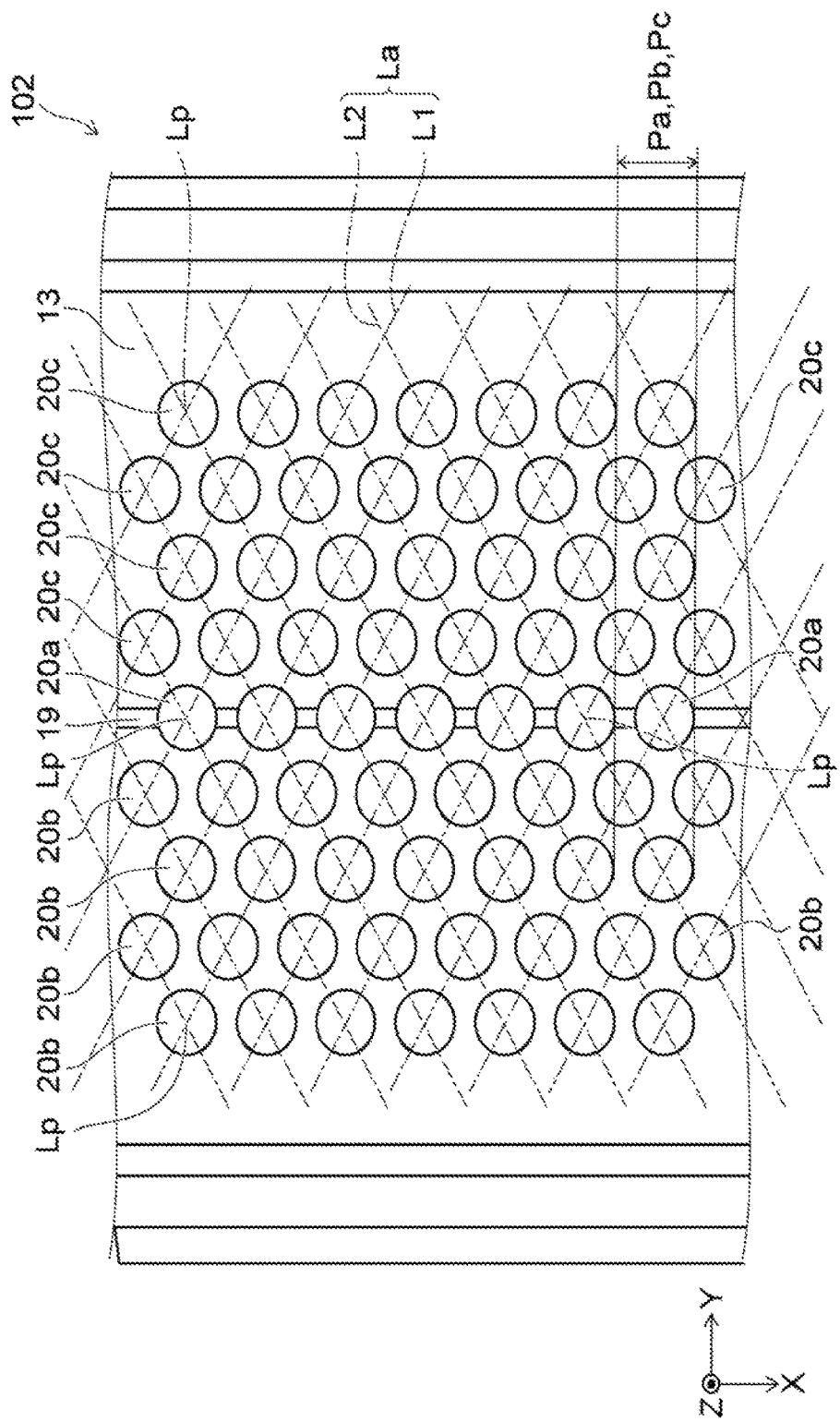
FIG. 13 is a plan view showing a semiconductor memory device according to a second comparative example.

Next, a second comparative example will be described. FIG. 13 is a plane view showing a semiconductor memory device according to the comparative example.

As shown in FIG. 13, in a semiconductor memory device 102 according to the comparative example, a columnar member 20a is provided at each lattice point Lp of the lattice La in the center portion in the Y direction of the stacked body 15. That is, the arrangement interval Pa of the columnar members 20a in the X direction is equal to the arrangement interval Pb of the columnar members 20b and the arrangement interval Pc of the columnar members 20c.

In the semiconductor memory device 102 according to the comparative example, since the arrangement density of the columnar members 20a is higher than that of the semiconductor memory device 1 (see FIG. 2) according to the first embodiment, the formation of the voids 28 is reduced. However, the effective width of the electrode film 13, that is, the length in the Y direction is short on average because the arrangement density of the columnar members 20a is high. Therefore, the semiconductor memory device 102 has higher electric resistance in the X direction of the electrode film 13 compared with the semiconductor memory device 1 (see FIG. 2).

(Second Embodiment)

Figure 14:
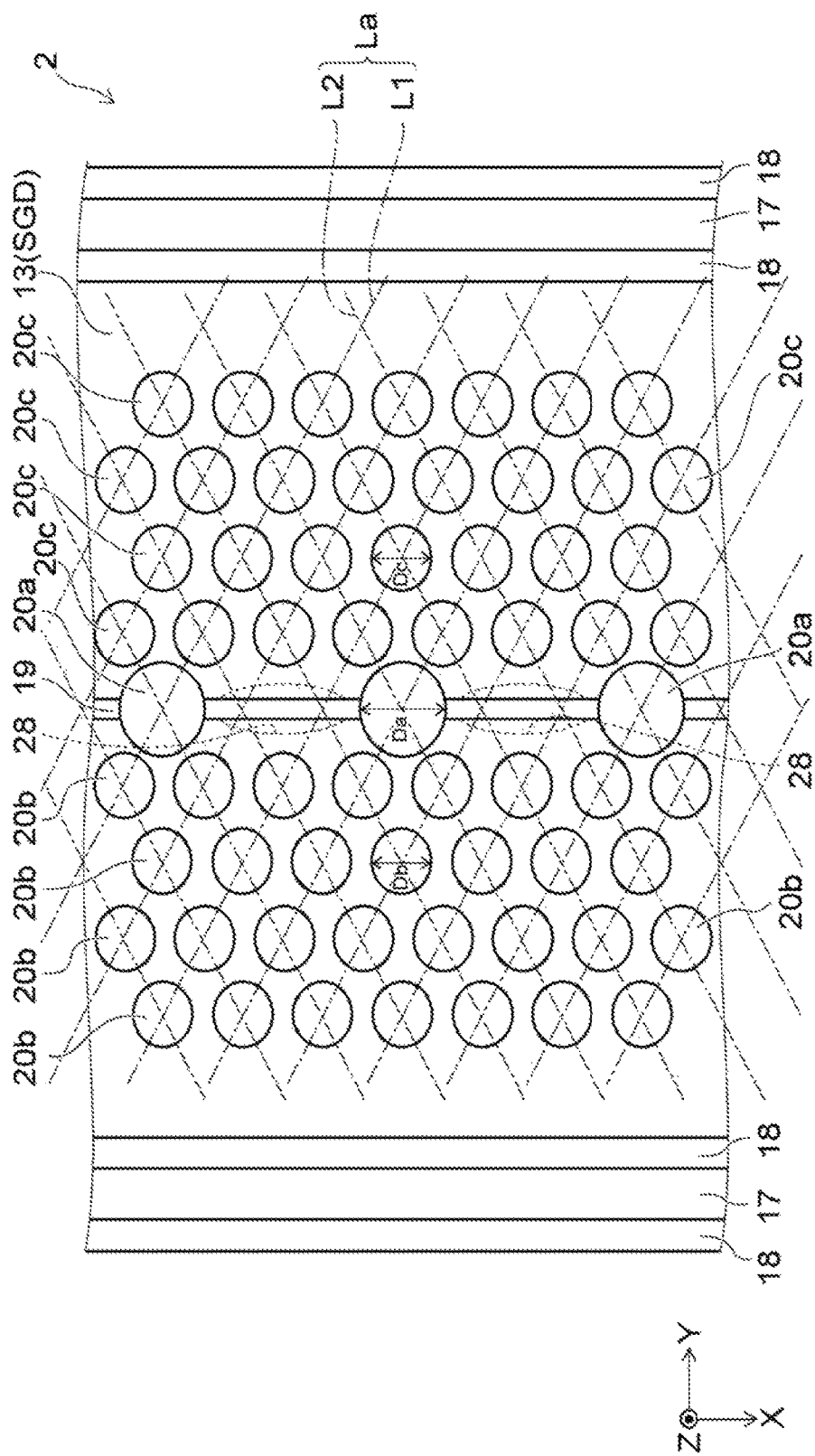
FIG. 14 is a plan view showing a semiconductor memory device according to a second embodiment.

Next, a second embodiment will be described. FIG. 14 is a plane view showing a semiconductor memory device according to the embodiment.

As shown in FIG. 14, in the semiconductor memory device 2 according to the embodiment, the maximum diameter Da of the columnar member 20a when viewed from the Z direction is larger than the maximum diameter Db of the columnar member 20b and the maximum diameter Dc of the columnar member 20c. That is, Da>Db and Da>Dc. It is noted that when the columnar member 20 does not have a perfect circle shape when viewed from the Z direction, the diameter of the circumscribed circle of the columnar member 20 is taken as the maximum diameter.

In the above-mentioned first embodiment, the columnar member 20a is not always arranged at every lattice point Lp (see FIG. 2) of the lattice La unlike the columnar members 20b and 20c. Therefore, in the lithography step shown in FIG. 8, it may be difficult to form the memory hole 55 where the columnar member 20a is formed, depending on the conditions.

Therefore, in the embodiment, the memory hole 55 where the columnar member 20a is formed is larger than the memory hole 55 where the columnar members 20b and 20c are formed. This facilitates formation of the memory hole 55. As a result, in the manufactured semiconductor memory device 2, the maximum diameter of the columnar member 20a may be larger than the maximum diameter of the columnar member 20b and the maximum diameter of the columnar member 20c. It is noted that since no memory cell transistor MC is formed by the columnar member 20a, it is unnecessary to consider the electrical characteristics thereof.

The configuration, manufacturing method and effects of the embodiment other than those described above are the same as those in the above-mentioned first embodiment.

(Third Embodiment)

Figure 15:
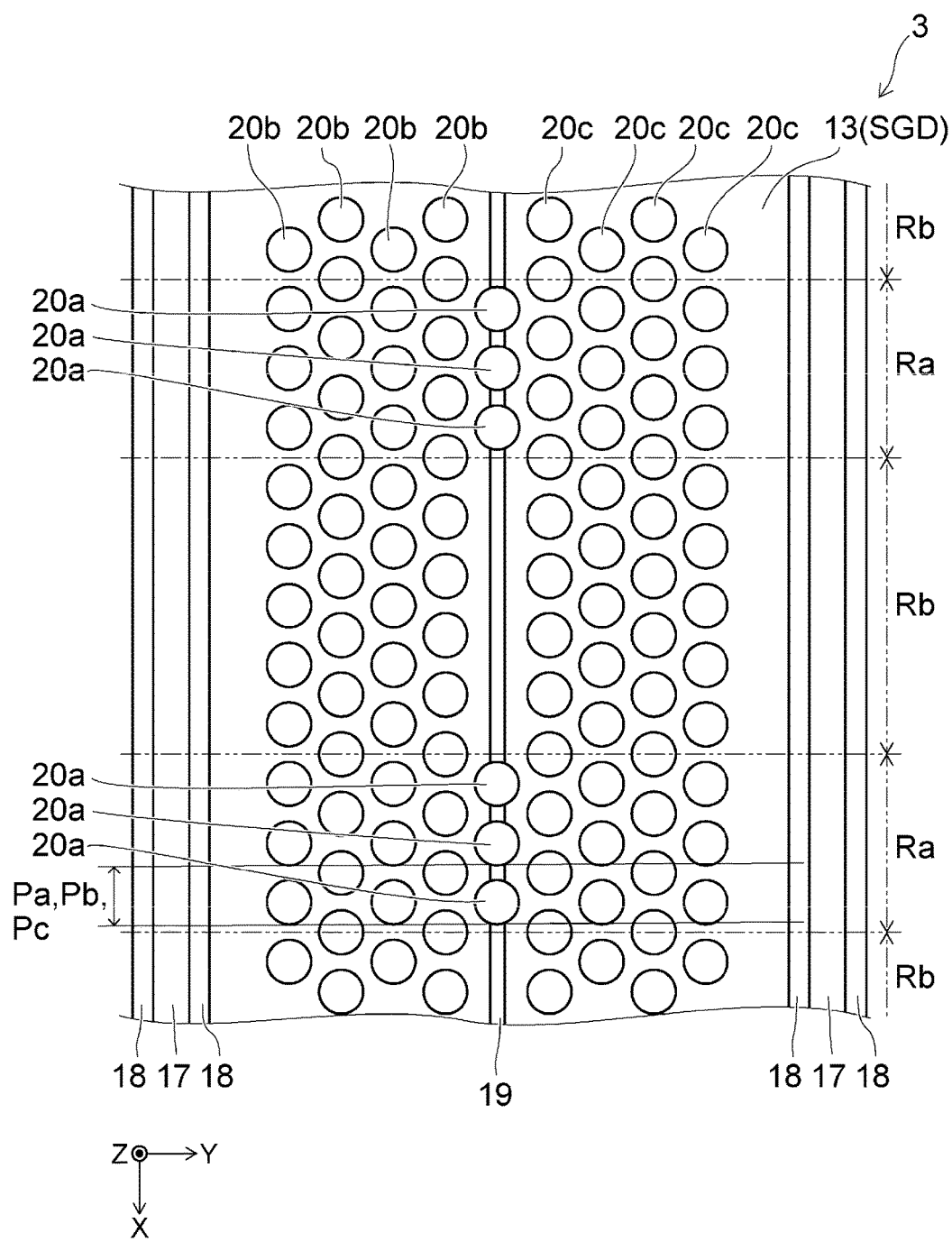
FIG. 15 is a plan view showing a semiconductor memory device according to a third embodiment.

Next, a third embodiment will be described. FIG. 15 is a plane view showing a semiconductor memory device according to the embodiment.

As shown in FIG. 15, in a semiconductor memory device 3 according to the embodiment, regions Ra and regions Rb are alternately arranged along the X direction. The length of each of the regions Rb in the X direction is longer than the length of each of the regions Ra in the X direction. It is noted that, as described in a sixth embodiment to be described later, the length of the region Rb may be shorter than or equal to the length of the region Ra. In the embodiment, a plurality of, for example, three columnar members 20a are provided in the region Ra. For example, in the region Ra, a columnar member 20a is provided at each lattice point Lp (see FIG. 2). In this case, in the region Ra, the arrangement interval Pa of the columnar member 20a in the X direction is substantially equal to the arrangement interval Pb of the columnar member 20b and the arrangement interval Pc of the columnar member 20c. On the other hand, no columnar member 20a is provided in the region Rb. The columnar members 20b and 20c are periodically provided in both the region Ra and the region Rb.

According to the embodiment, in the region Ra, a columnar member 20a is provided at each lattice point Lp (see FIG. 2). Thus, this facilitates lithography to form the memory hole 55 (see FIG. 8). As a result, the memory hole 55 can be stably formed, and the columnar member 20a can be stably formed. The configuration, manufacturing method and effects of the embodiment other than those described above are the same as those in the above-mentioned first embodiment.

(Fourth Embodiment)

Figure 16:
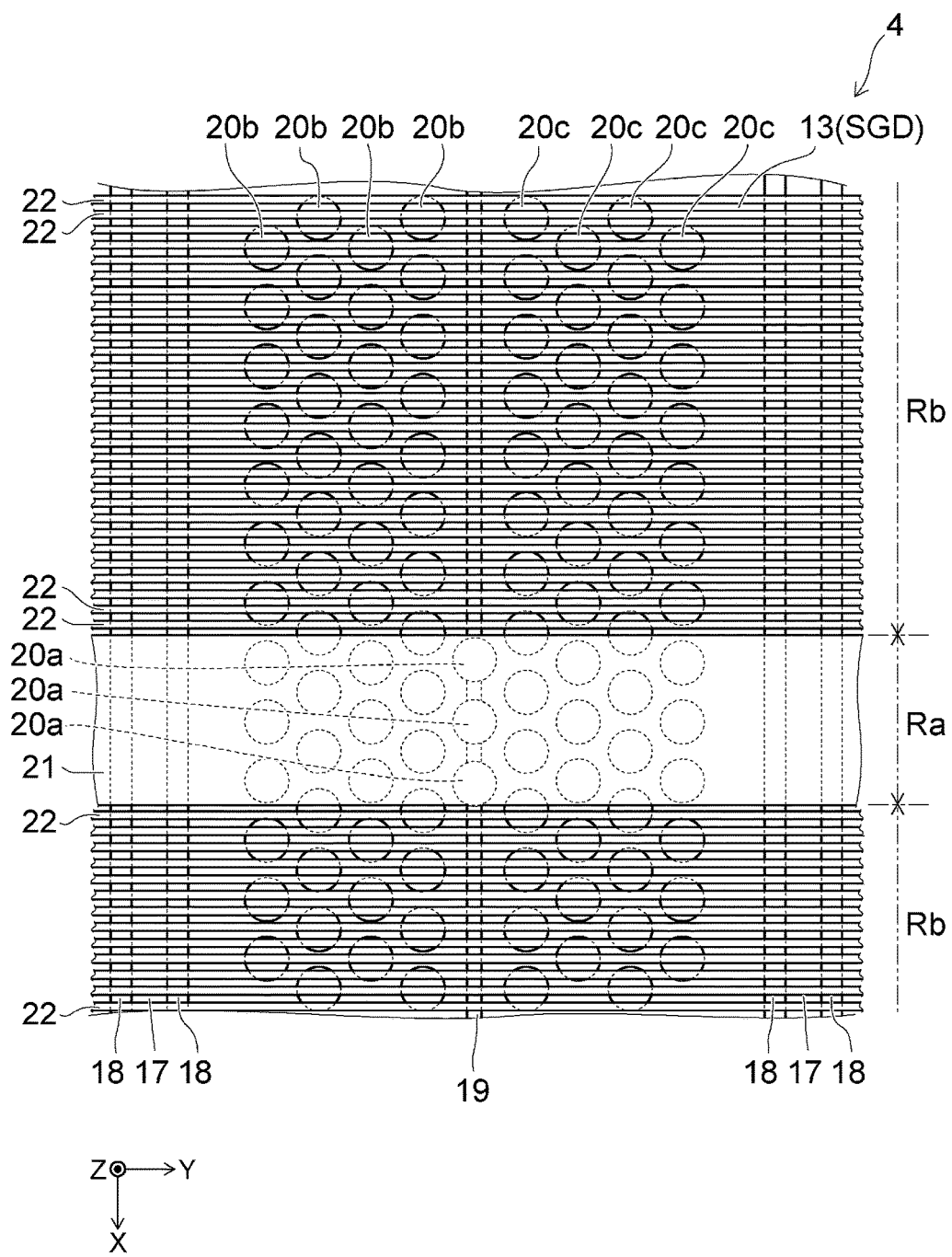
FIG. 16 is a plan view showing a semiconductor memory device according to a fourth embodiment.

Next, a fourth embodiment will be described. FIG. 16 is a plane view showing a semiconductor memory device according to the embodiment.

As shown in FIG. 16, in a semiconductor memory device 4 according to the embodiment, the region Ra is provided in a region directly below the source line 21, and the region Rb is provided in a region other than the region directly below the source line 21. Therefore, the columnar member 20a is disposed between the silicon substrate 10 and the source line 21.

According to the embodiment, the columnar member 20a where no NAND string is constituted, and no memory cell transistor MC is formed is disposed in a region directly below the source line 21. Since the bit line 22 cannot be originally disposed in the region where the source line 21 is formed, a NAND string cannot be constituted by the columnar member 20 disposed in the region directly below the source line 21. Therefore, according to the embodiment, dead space is effectively utilized so as to arrange the columnar members 20a, thus, it is possible to reduce the formation of voids 28. The configuration, manufacturing method and effects of the embodiment other than those described above are the same as those in the above-mentioned third embodiment.

(Fifth Embodiment)

Figure 17:
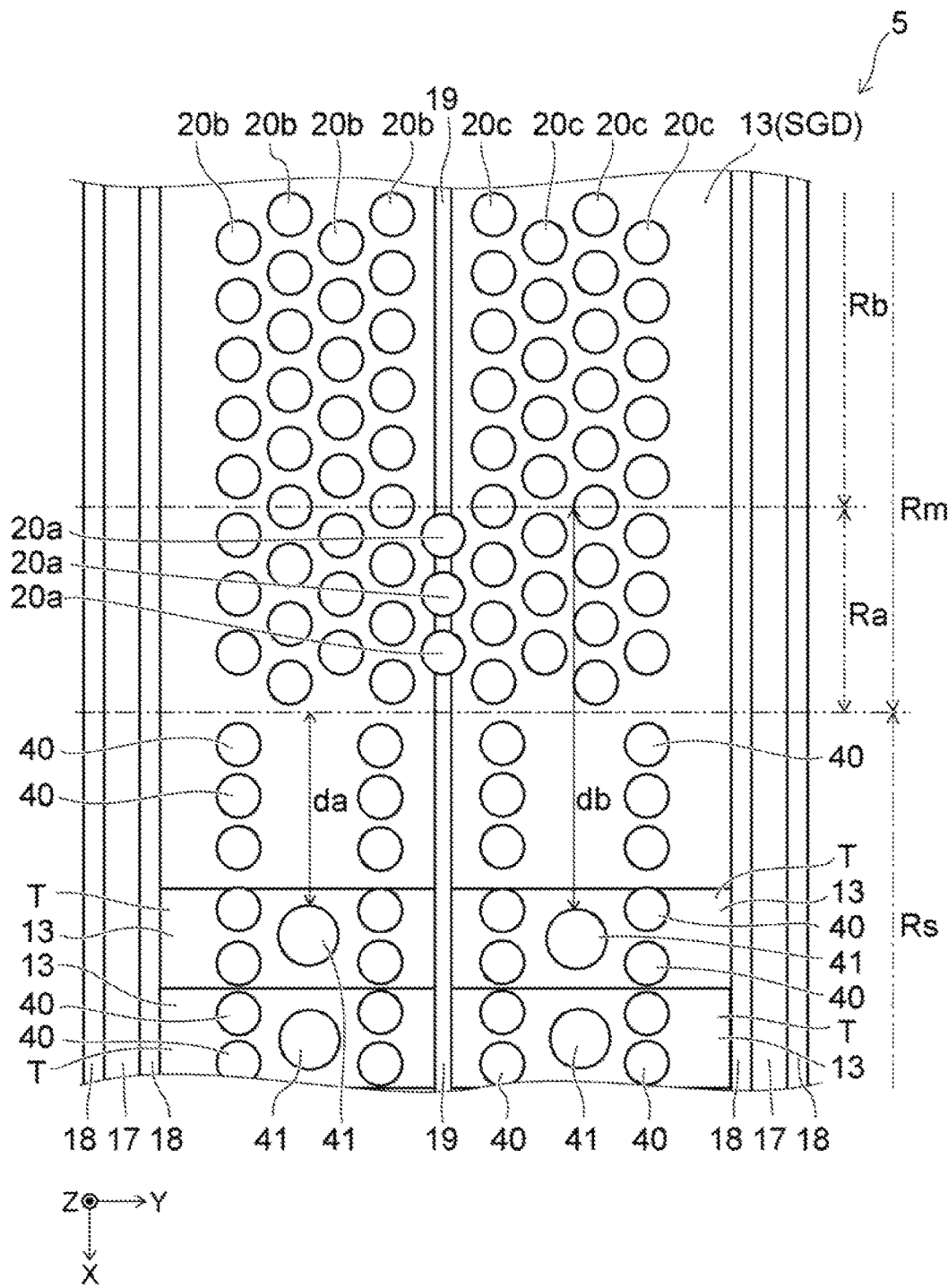
FIG. 17 is a plan view showing a semiconductor memory device according to a fifth embodiment.

Next, a fifth embodiment will be described. FIG. 17 is a plane view showing a semiconductor memory device according to the embodiment.

As shown in FIG. 17, in a semiconductor memory device 5 according to the embodiment, a memory cell region Rm is provided, and a staircase region Rs is provided on each side in the X direction of the memory cell region Rm. In the memory cell region Rm, the stacked body 15 is provided to the uppermost layer, the columnar members 20 are provided so as to penetrate the stacked body 15, and a large number of memory cell transistors MC are formed.

On the other hand, in the staircase region Rs, the stacked body 15 is processed in a staircase shape, and a terrace T is formed for each electrode film 13. Support members 40 are provided in the staircase region Rs. Each support member 40 has a substantially columnar shape extending in the Z direction, penetrating the stacked body 15, and the lower end thereof is in contact with the silicon substrate 10. The structure of the support member 40 is the same as the structure of the columnar member 20. In the staircase region Rs, contacts 41 are also provided on the stacked body 15. The lower end of each contact 41 is connected to the electrode film 13 in the terrace T. In the staircase region Rs, no memory cell transistor MC is formed.

A region Ra is provided at a position in contact with the staircase region Rs in the memory cell region Rm. In addition, a region Rb is also provided in the memory cell region Rm. The region Ra is disposed between the staircase region Rs and the region Rb. As described above, the columnar members 20*a* are disposed only in the region Ra. It is noted that, in the memory cell region Rm, additional regions Ra may be provided. Therefore, the distance da between the region Ra and the contact 41 is shorter than the distance db between the region Rb and the contact 41. That is, da<db.

It is noted that the boundary between the region Ra and the region Rb may be defined as the YZ plane including the midpoint between two lattice points Lp (see FIG. 2) adjacent to each other in the X direction, the columnar member 20*a* being disposed at one of the lattice points Lp, and no columnar member 20*a* being disposed at the other of the lattice points Lp. Further, the boundary between the memory cell region Rm and the staircase region Rs may be defined as the YZ plane including the midpoint between a lattice point Lp included in the columnar member 20 disposed at the endmost portion in the X direction and another lattice point Lp adjacent to the lattice point Lp in the X direction and at which no columnar member 20*a* is disposed.

According to the embodiment, the columnar member 20*a* where no memory cell transistor MC is formed is disposed in a region that is in contact with the staircase region Rs in the memory cell region Rm. However, the columnar member 20 provided in this region is originally formed as a dummy where no memory cell transistor MC is constituted. Therefore, according to the embodiment, dead space is effectively utilized so as to arrange the columnar members 20*a*, thus, it is possible to reduce the formation of voids 28. The configuration, manufacturing method and effects of the embodiment other than those described above are the same as those in the above-mentioned third embodiment.

(Sixth Embodiment)

Figure 18:
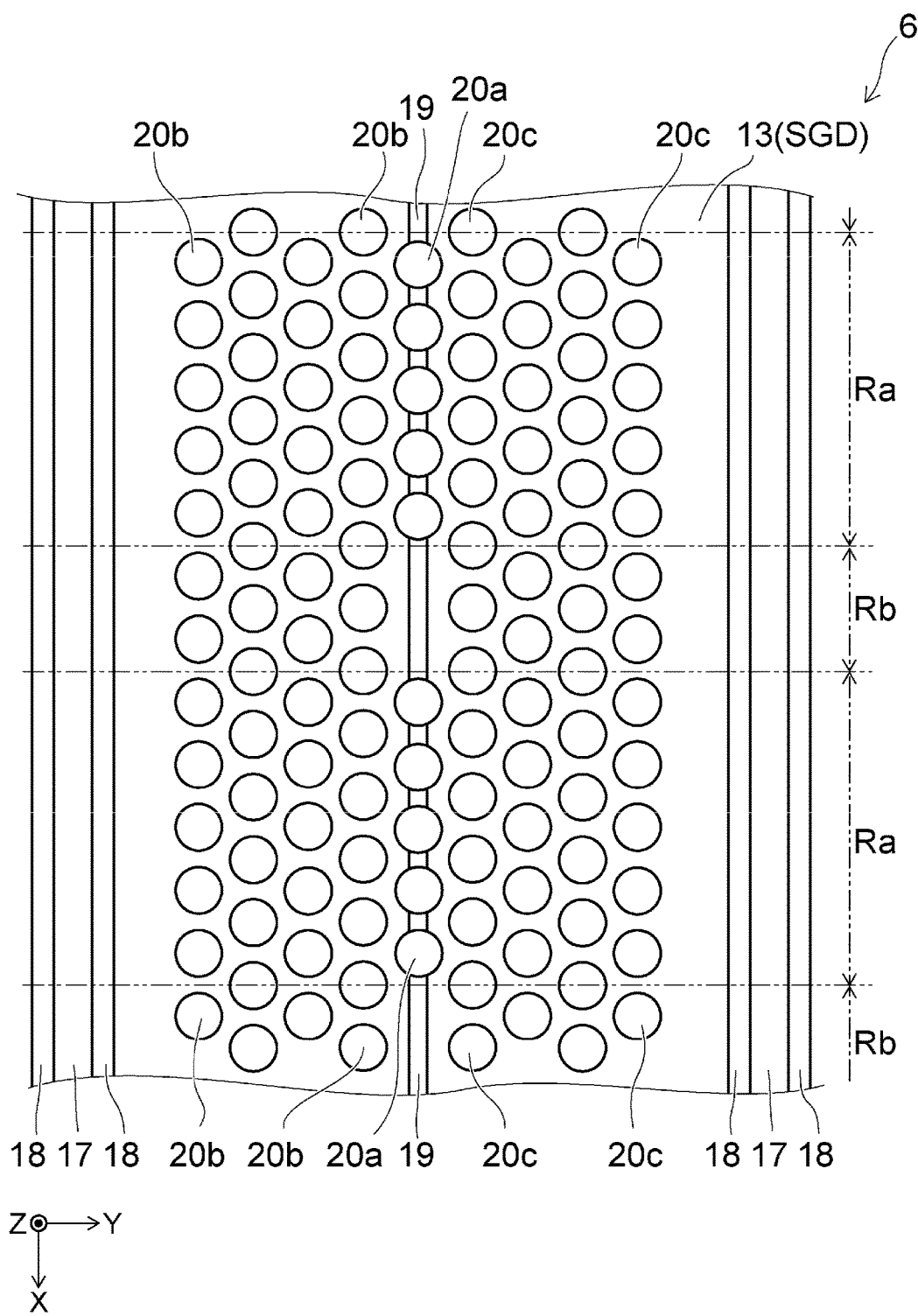
FIG. 18 is a plan view showing a semiconductor memory device according to a sixth embodiment.

Next, a sixth embodiment will be described. FIG. 18 is a plane view showing a semiconductor memory device according to the embodiment.

As shown in FIG. 18, in the semiconductor memory device 6 according to the embodiment, the length of the region Rb in which no columnar member 20*a* is provided in the X direction is shorter than the length of the region Ra in which the columnar member 20*a* is provided. This can also achieve the same effects as in the above-mentioned third embodiment. The configuration, manufacturing method and effects of the embodiment other than those described above are the same as those in the above-mentioned third embodiment.

(Seventh Embodiment)

Figure 19:
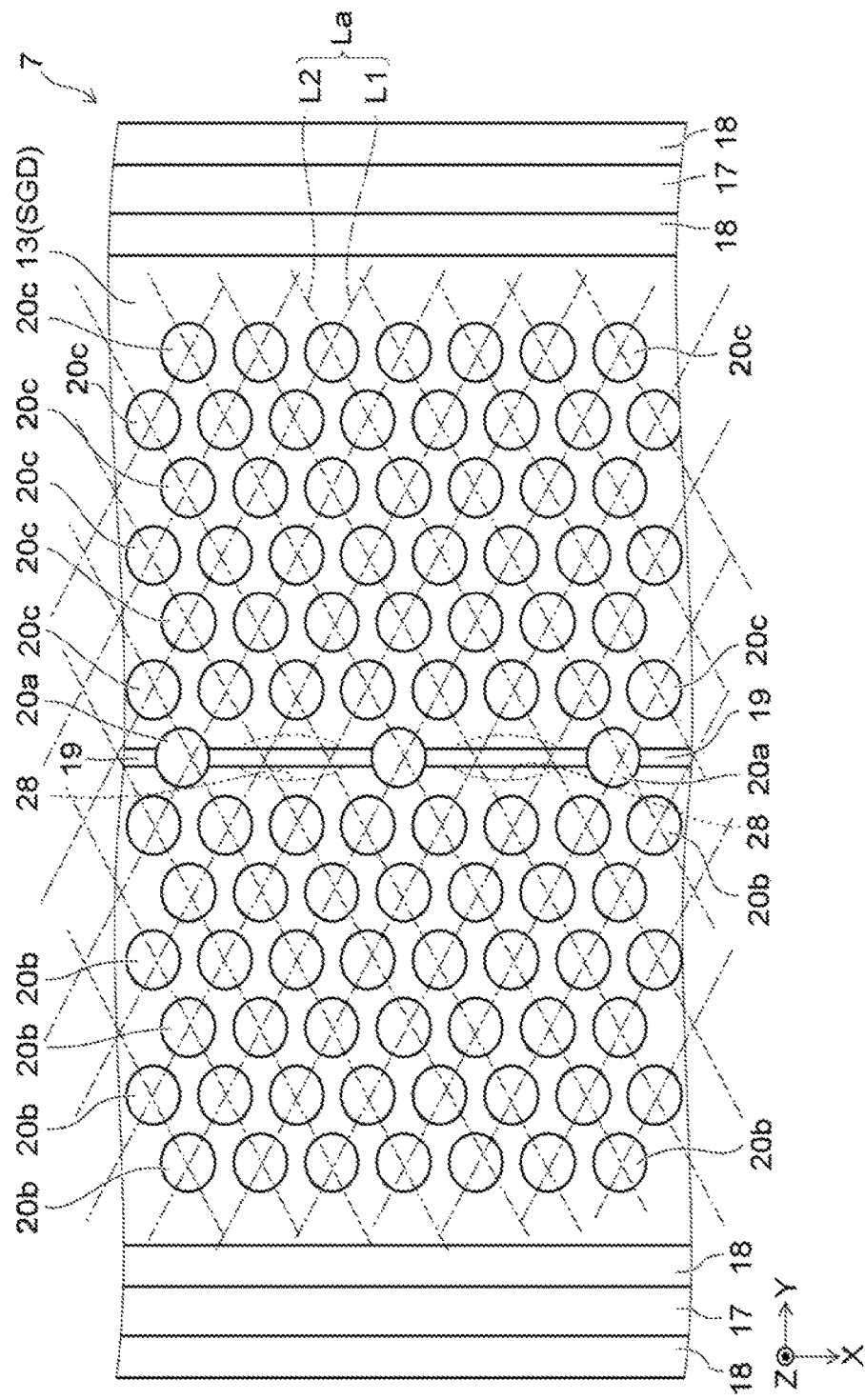
FIG. 19 is a plan view showing a semiconductor memory device according to a seventh embodiment.

Next, a seventh embodiment will be described. FIG. 19 is a plane view showing a semiconductor memory device according to the embodiment.

As shown in FIG. 19, in a semiconductor memory device 7 according to the embodiment, six columnar members 20*b* are arranged along the straight line L1, and six columnar members 20*c* are also arranged along the straight line L1.

According to the embodiment, since six columns of columnar members 20*b* and 20*c* are disposed on both sides of the insulating member 19 in the single stacked body 15, the degree of integration of the memory cell transistor MC is higher compared with the semiconductor memory device 1 (see FIG. 2) according to the above-mentioned first embodiment. On the other hand, in the embodiment, since the center portion in the Y direction of the stacked body 15 is farther from the slits 57, and the number of the columnar members 20 interposed between the center portion in the Y direction and the slits 57 is increased, the material of the electrode film 13 is more difficult to reach. As a result, the voids 28 are more likely to be formed. Therefore, it is more effective that the columnar members 20*a* are provided at the center portion in the Y direction of the stacked body 15. The configuration, manufacturing method and effects of the embodiment other than those described above are the same as those in the above-mentioned first embodiment.

According to the embodiment described above, it is possible to achieve a semiconductor memory device with low electric resistance of the electrode film.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions. In addition, respective embodiments described above may be combined with one another.

What is claimed is:

1. A semiconductor memory device, comprising:
    a first electrode layer extending in a first direction;
    a second electrode layer separated in a second direction from the first electrode layer, the second direction intersecting the first direction, the second electrode layer extending in the first direction;
    a third electrode layer separated in the second direction from the first electrode layer, the third electrode layer extending in the first direction;
    an insulating member between the second electrode layer and the third electrode layer, and extending in the first direction;
    first semiconductor members extending through the first electrode layer and the second electrode layer;
    second semiconductor members extending through the first electrode layer and the third electrode layer; and
    third semiconductor members extending in the second direction, each having a first portion that is between the second electrode layer and the third electrode layer and in contact with the insulating member, and a second portion that extends through the first electrode layer, wherein, in the first direction, an arrangement density of the third semiconductor members is lower than those of the first semiconductor members and the second semiconductor members.

2. The semiconductor memory device according to claim 1, wherein
the first semiconductor members are arranged at a first regular interval along the first direction; and
the second semiconductor members are arranged at the first regular interval along the first direction.

3. The semiconductor memory device according to claim 2, wherein the third semiconductor members are arranged at a second regular interval longer than the first interval along the first direction.

4. The semiconductor memory device according to claim 3, wherein the second regular interval is an integral multiple of the first interval.

5. The semiconductor memory device according to claim 2, wherein
the third semiconductor members are arranged at the first regular interval along the first direction in a first region that also includes a portion of the first semiconductor members and a portion of the second semiconductor members on either side of the third semiconductor members; and
no third semiconductor member is arranged in a second region located in the first direction from the first region and having a length in the first direction longer than the first regular interval.

6. The semiconductor memory device according to claim 5, further comprising:
a substrate;
a wiring provided directly above the first region and extending in a third direction that intersects a plane including the first direction and the second direction; and
a conductive member connected between the substrate and the wiring,
wherein the third semiconductor members are disposed between the substrate and the wiring.

7. The semiconductor memory device according to claim 5, further comprising:
a contact connected to an end portion of the second electrode layer in the first direction,
wherein a distance from the first region to the contact is shorter than than a distance from the second region to the contact.

8. The semiconductor memory device according to claim 5, wherein a length of the second region in the first direction is longer than a length of the first region in the first direction.

9. The semiconductor memory device according to claim 5, wherein a length of the second region in the first direction is shorter than a length of the first region in the first direction.

10. The semiconductor memory device according to claim 1, wherein the maximum diameter of the third semiconductor members is larger than those of the first semiconductor members and the second semiconductor members when viewed from the second direction.

11. The semiconductor memory device according to claim 1, further comprising:
a wiring extending in a third direction intersecting a plane including the first direction and the second direction,
wherein the first semiconductor members and the second semiconductor members are connected to the wiring, and the third semiconductor members are insulated from the wiring.

12. The semiconductor memory device according to claim 1, wherein the first semiconductor members, the second semiconductor members and the third semiconductor members are disposed at points of a lattice, the lattice including a plurality of first virtual straight lines extending in a third direction intersecting a plane including the first direction and the second direction and periodically arranged and a plurality of second virtual straight lines extending in a fourth direction intersecting the plane and the third direction and periodically arranged.

13. The semiconductor memory device according to claim 1, wherein four of the first semiconductor members are arranged and four of the second semiconductor members are arranged in a third direction intersecting a plane including the first direction and the second direction.

14. The semiconductor memory device according to claim 1, wherein six of the first semiconductor members are arranged and six of the second semiconductor members are arranged in a third direction intersecting a plane including the first direction and the second direction.

15. The semiconductor memory device according to claim 1, wherein a void is formed between the third semiconductor members in the first electrode layer.

16. The semiconductor memory device according to claim 15, wherein the void is separated from the first semiconductor members, the second semiconductor members and the third semiconductor members.

17. The semiconductor memory device according to claim 1, further comprising:
first insulating layers between the first semiconductor members and the first electrode layer;
second insulating layers between the first semiconductor members and the first insulating layers; and
third insulating layers between the first insulating layers and the first electrode layer,
wherein a nitrogen concentration of the first insulating layers is higher than those of the second insulating layers and the third insulating layers.

* * * * *